United States Patent
Tang et al.

(10) Patent No.: US 12,374,608 B2
(45) Date of Patent: Jul. 29, 2025

(54) HYBRID CHIP CARRIER PACKAGE

(71) Applicant: Texas Instruments Incorporated, Dallas, TX (US)

(72) Inventors: Yiqi Tang, Allen, TX (US); Li Jiang, Allen, TX (US); Rajen Murugan, Dallas, TX (US); Robert John Falcone, Denison, TX (US); Usman Mahmood Chaudhry, Mckinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 474 days.

(21) Appl. No.: 17/965,583

(22) Filed: Oct. 13, 2022

(65) Prior Publication Data
US 2024/0128170 A1 Apr. 18, 2024

(51) Int. Cl.
*H01L 23/498* (2006.01)
*H01L 21/48* (2006.01)
*H01L 23/373* (2006.01)
*H01L 23/66* (2006.01)

(52) U.S. Cl.
CPC .... *H01L 23/49805* (2013.01); *H01L 21/4853* (2013.01); *H01L 21/4857* (2013.01); *H01L 21/486* (2013.01); *H01L 23/3736* (2013.01); *H01L 23/49811* (2013.01); *H01L 23/49822* (2013.01); *H01L 23/49838* (2013.01); *H01L 23/66* (2013.01); *H01L 2223/6622* (2013.01);
(Continued)

(58) Field of Classification Search
CPC ........... H01L 23/49805; H01L 23/3736; H01L 23/49811; H01L 23/49822; H01L 23/49838; H01L 23/66; H01L 21/4853; H01L 21/4857; H01L 21/486; H01L 2223/6622; H01L 2223/6644; H01L 2223/6677; H01L 2223/6688
See application file for complete search history.

(56) References Cited

U.S. PATENT DOCUMENTS

| | | | | |
|---|---|---|---|---|
| 5,006,922 A | * | 4/1991 | McShane | H01L 23/04 361/783 |
| 2014/0312438 A1 | * | 10/2014 | Takada | B81C 1/00253 257/415 |
| 2015/0255702 A1 | * | 9/2015 | Takebayashi | H05K 1/0298 174/250 |

OTHER PUBLICATIONS

"TRF1208 10 MHz to 11 GHz 3-dB BW, ADC Driver Amplifier", Texas Instruments data sheet SBOS972B, Oct. 2021, revised Apr. 2022, 30 pages.

* cited by examiner

*Primary Examiner* — Peniel M Gumedzoe

(74) *Attorney, Agent, or Firm* — Ronald O. Neerings; Frank D. Cimino

(57) ABSTRACT

An electronic device includes a rectangular ceramic package structure having opposite first and second sides, an interior cavity that extends to an opening in the second side, opposite third and fourth sides spaced along a first direction, opposite fifth and sixth sides spaced along an orthogonal second direction, and non-conductive indents extending into the third and fourth sides. The device also includes a semiconductor die in the cavity, a lid that covers the opening and seals the cavity, a conductive terminal having a planar side exposed along the first side that is electrically coupled to a circuit of the semiconductor die and extends to a first one of the non-conductive indents, and conductive pins spaced apart from the conductive terminal and extending outward from the first side of the ceramic package structure along a third direction.

20 Claims, 20 Drawing Sheets

(52) U.S. Cl.
CPC ............... *H01L 2223/6644* (2013.01); *H01L 2223/6677* (2013.01); *H01L 2223/6688* (2013.01)

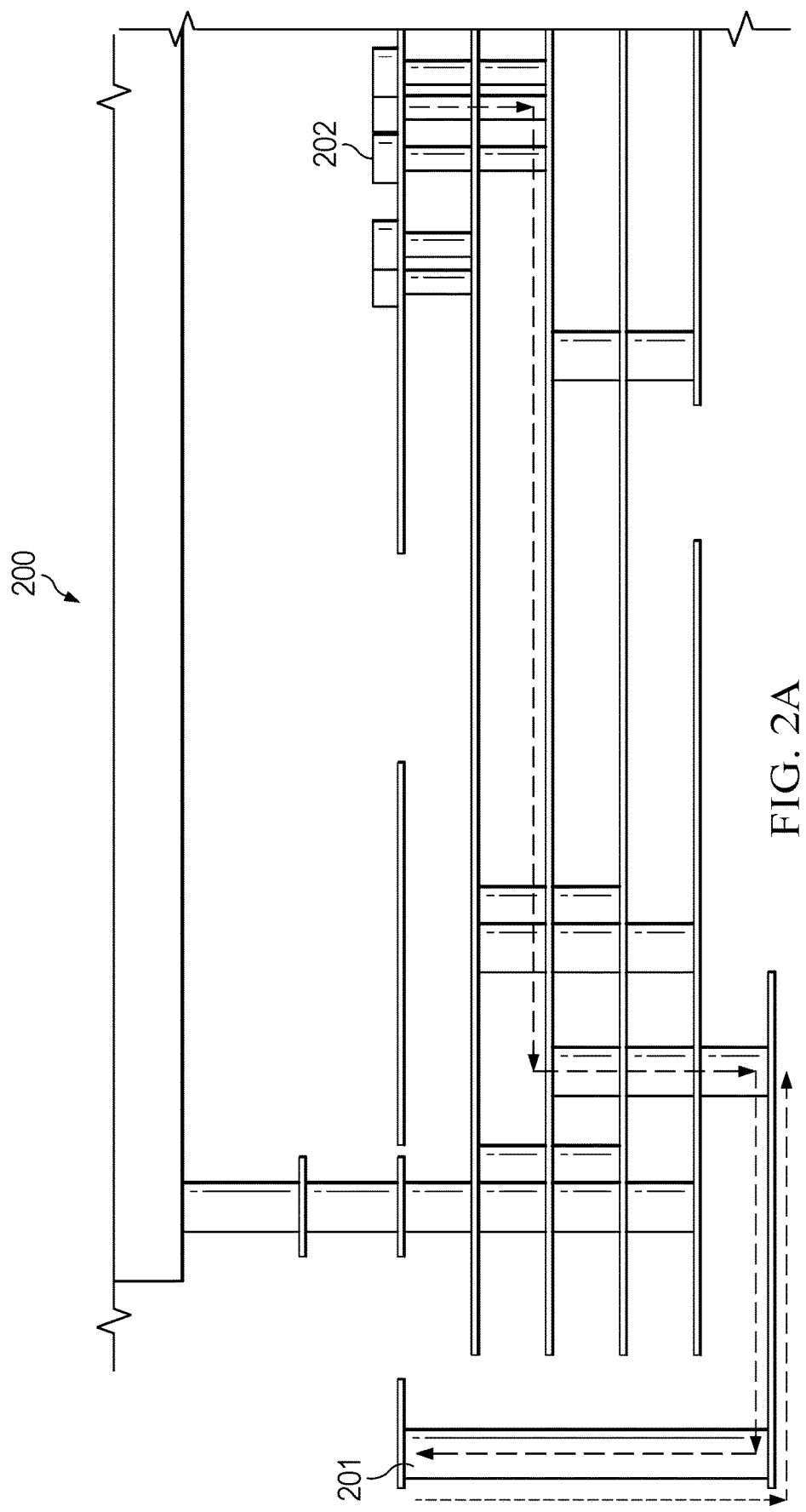

US 12,374,608 B2

HYBRID CHIP CARRIER PACKAGE

BACKGROUND

Leadless chip carriers (LCC or LLCC) are surface mount device (SMD) integrated circuit (IC) packages that have no pins/leads, and instead use metal pads at the outer edges to establish connection with a printed circuit board (PCB). Leadless ceramic chip carrier (LCCC) devices provide a low profile multilayer ceramic package with short internal electrical traces from a die to metalized castellations around some or all sides and on the bottom of the package for soldering directly to the PCB or insertion into a socket. Castellated holes or castellations are semi-plated partial holes or indentations created on the edges of a PCB, and castellations help provide proper alignment in the mounting of one PCB on top of another or in soldering LCCC devices to a PCB. Although plated castellations are used along the sides of LCCC devices to improve alignment and board level reliability (BLR) performance by providing a conductive surface for solder wicking, castellation structures on high frequency channels can behave as a quarter-wavelength resonator and adversely impact circuit performance especially at high operating frequencies.

SUMMARY

In one aspect, an electronic device includes a package structure, a semiconductor die, a conductive terminal, and conductive pins. The package structure has opposite first and second sides, opposite third and fourth sides spaced apart from one another along a first direction, opposite fifth and sixth sides spaced apart from one another along a second direction that is orthogonal to the first direction, and non-conductive indents extending into one of the third and fourth sides. The semiconductor die is in the cavity, and a lid that covers the opening and seals the cavity. The conductive terminal has a planar side exposed along the first side of the ceramic package structure, the conductive terminal is electrically coupled to a circuit of the semiconductor die, and the conductive terminal extends to a first one of the non-conductive indents. The conductive pins are spaced apart from the conductive terminal and extend outward from the first side of the ceramic package structure along a third direction that is orthogonal to the first and second directions.

In another aspect, a ceramic package structure includes opposite first and second sides, an interior cavity that extends to an opening in the second side, opposite third and fourth sides spaced apart from one another along a first direction, opposite fifth and sixth sides spaced apart from one another along a second direction that is orthogonal to the first direction, non-conductive indents extending into one of the third and fourth sides, a conductive terminal having a planar side exposed along the first side of the ceramic package structure and extending to a first one of the non-conductive indents, and conductive pins spaced apart from the conductive terminal and extending outward from the first side of the ceramic package structure along a third direction that is orthogonal to the first and second directions.

In a further aspect, a method of fabricating an electronic device includes forming a laminated ceramic package structure, comprising: opposite first and second sides; an interior cavity that extends to an opening in the second side; opposite third and fourth sides spaced apart from one another along a first direction; opposite fifth and sixth sides spaced apart from one another along a second direction that is orthogonal to the first direction; non-conductive indents extending into the third and fourth sides; a conductive terminal having a planar side exposed along the first side of the ceramic package structure and extending to a first one of the non-conductive indents. The method also includes forming conductive pins spaced apart from the conductive terminal and extending outward from the first side of the ceramic package structure along a third direction that is orthogonal to the first and second directions, attaching a semiconductor die to the laminated ceramic package structure in the cavity, electrically coupling the conductive terminal to a circuit of the semiconductor die, and attaching a lid to cover the opening and seal the cavity.

BRIEF DESCRIPTION OF THE DRAWINGS

FIG. 2A is a partial side view showing internal details of the electronic device of FIG. 2 with a conductive plated castellation forming a high-frequency antenna.

DETAILED DESCRIPTION

Figure 1:
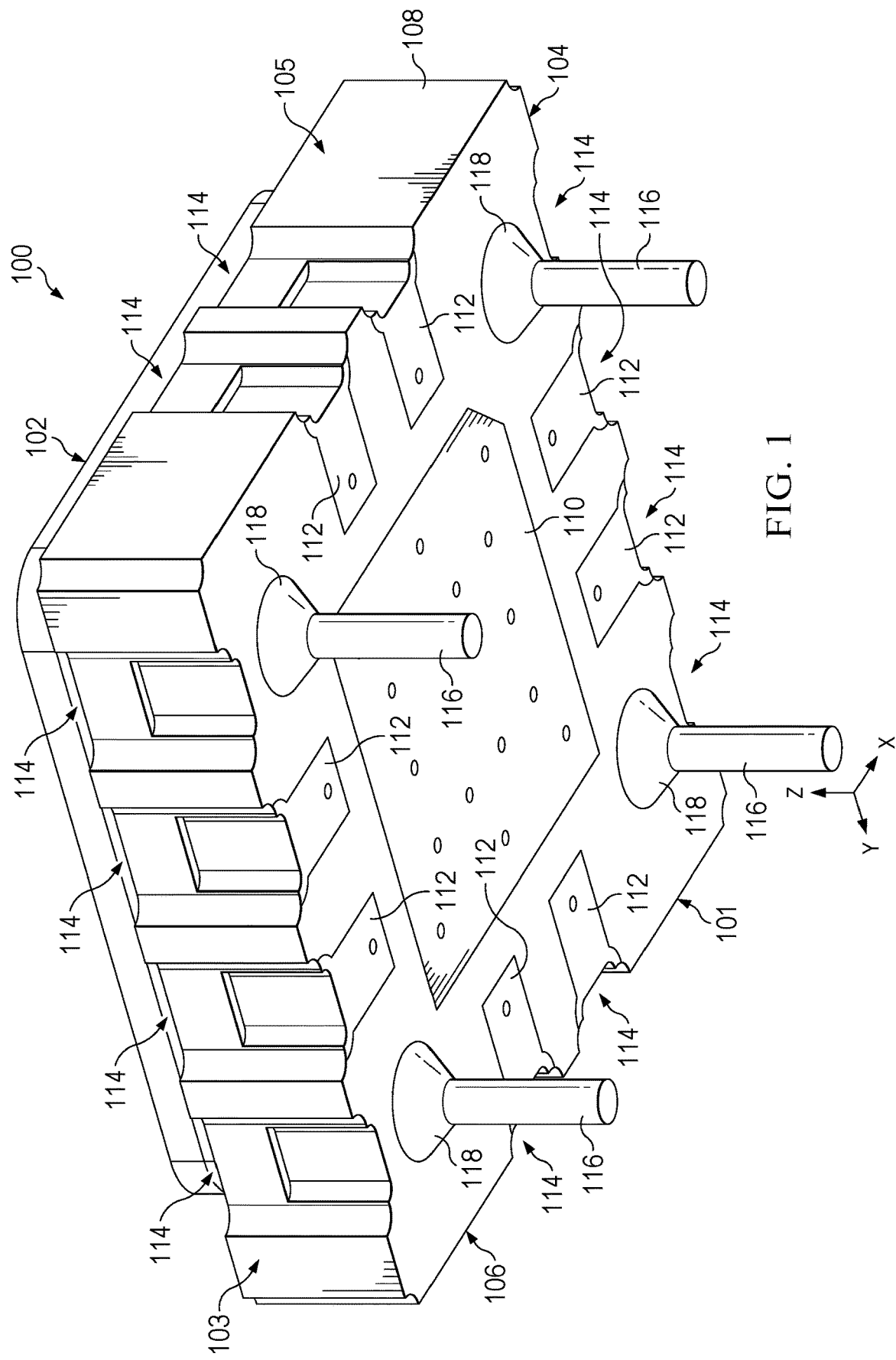
FIG. 1 is a bottom perspective view of a leadless ceramic chip carrier electronic device with non-conductive indents.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figure 1A:
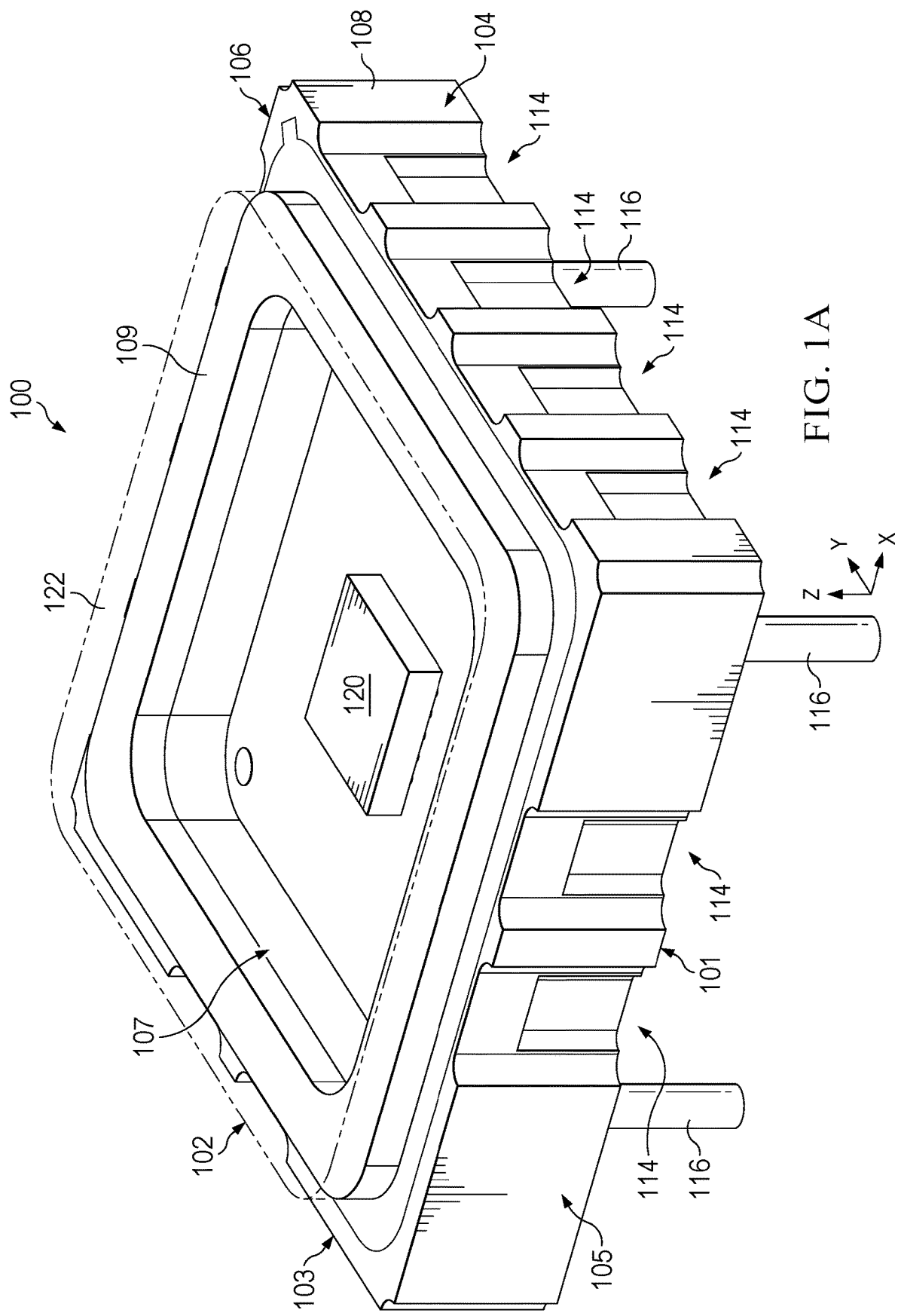
FIG. 1A is a top perspective view of the electronic device of FIG. 1.
Figure 1B:
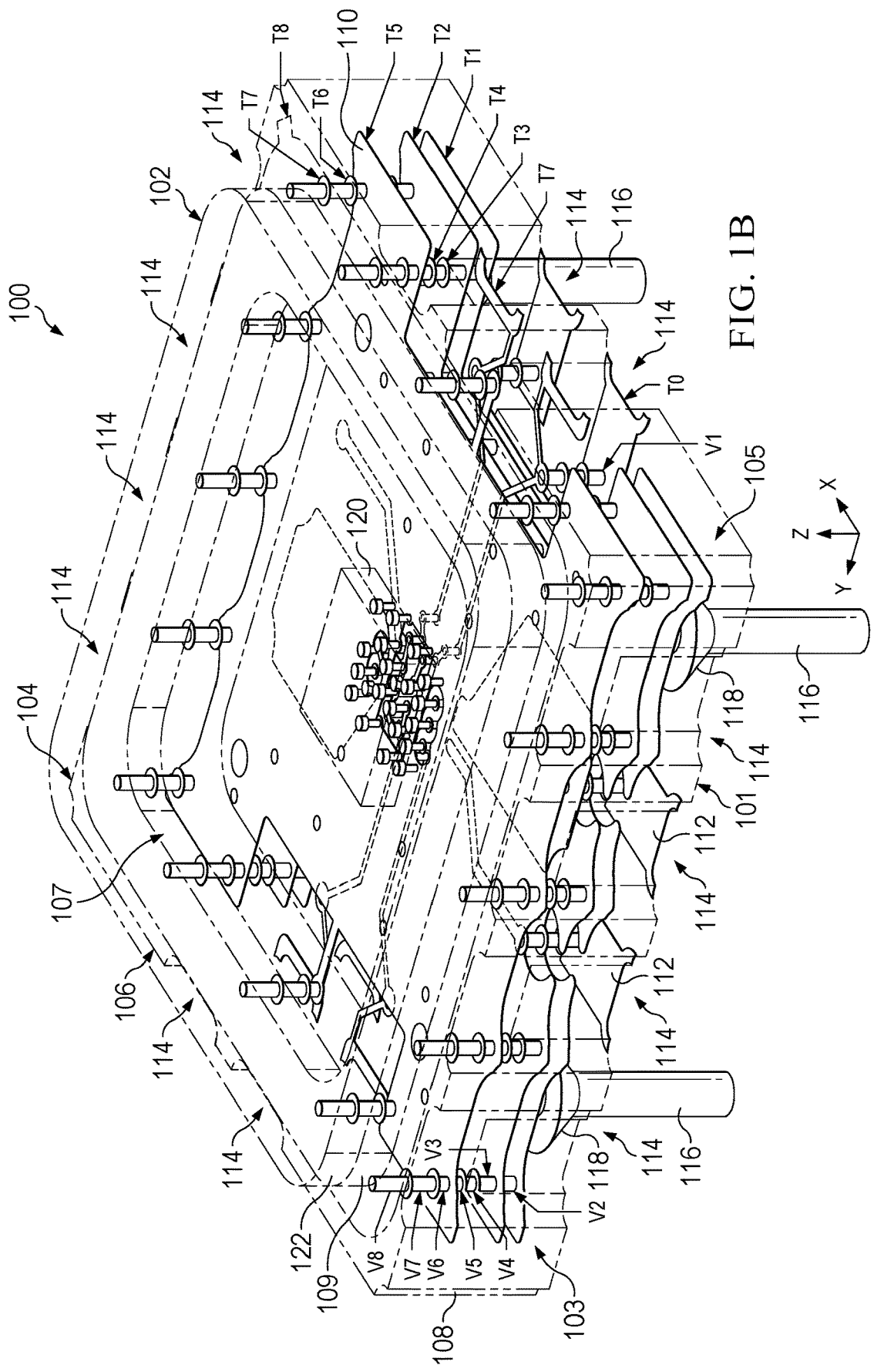
FIG. 1B is a top perspective view showing internal details of the multilevel ceramic package structure of the electronic device of FIG. 1.
Figure 1C:
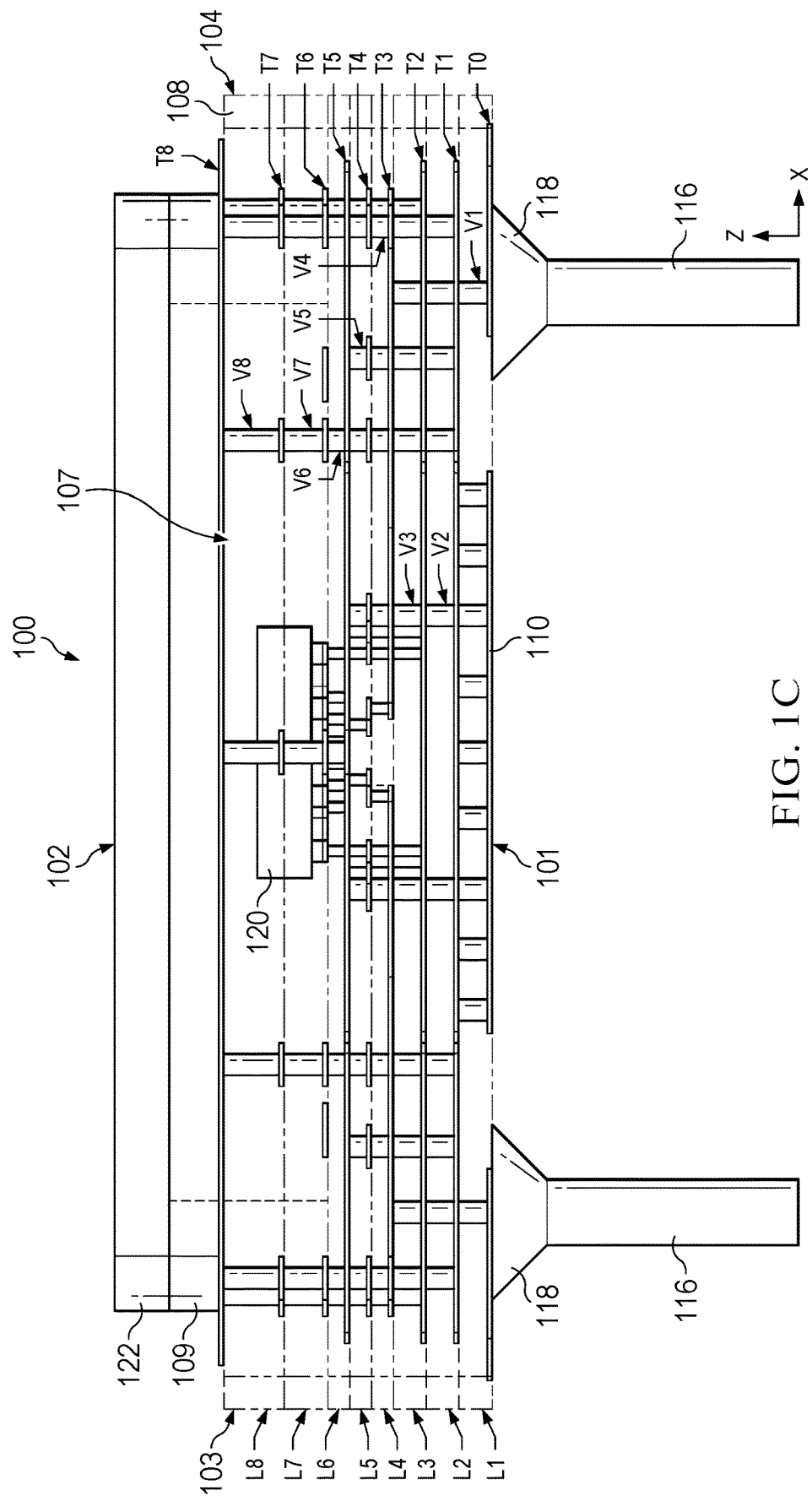
FIG. 1C is a side elevation view showing internal details of the multilevel ceramic package structure of the electronic device of FIG. 1.
Figure 1D:
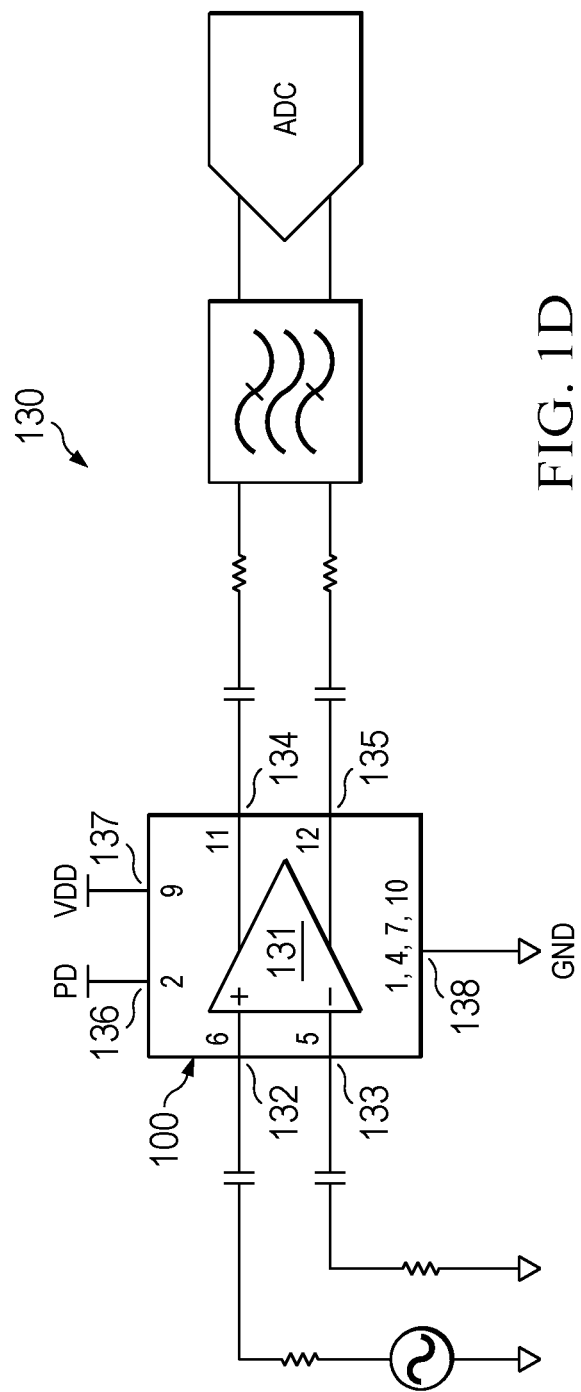
FIG. 1D is a schematic system diagram illustrating a high speed amplifier circuit of a semiconductor die of the electronic device of FIG. 1 in a high speed system circuit.
Figure 1E:
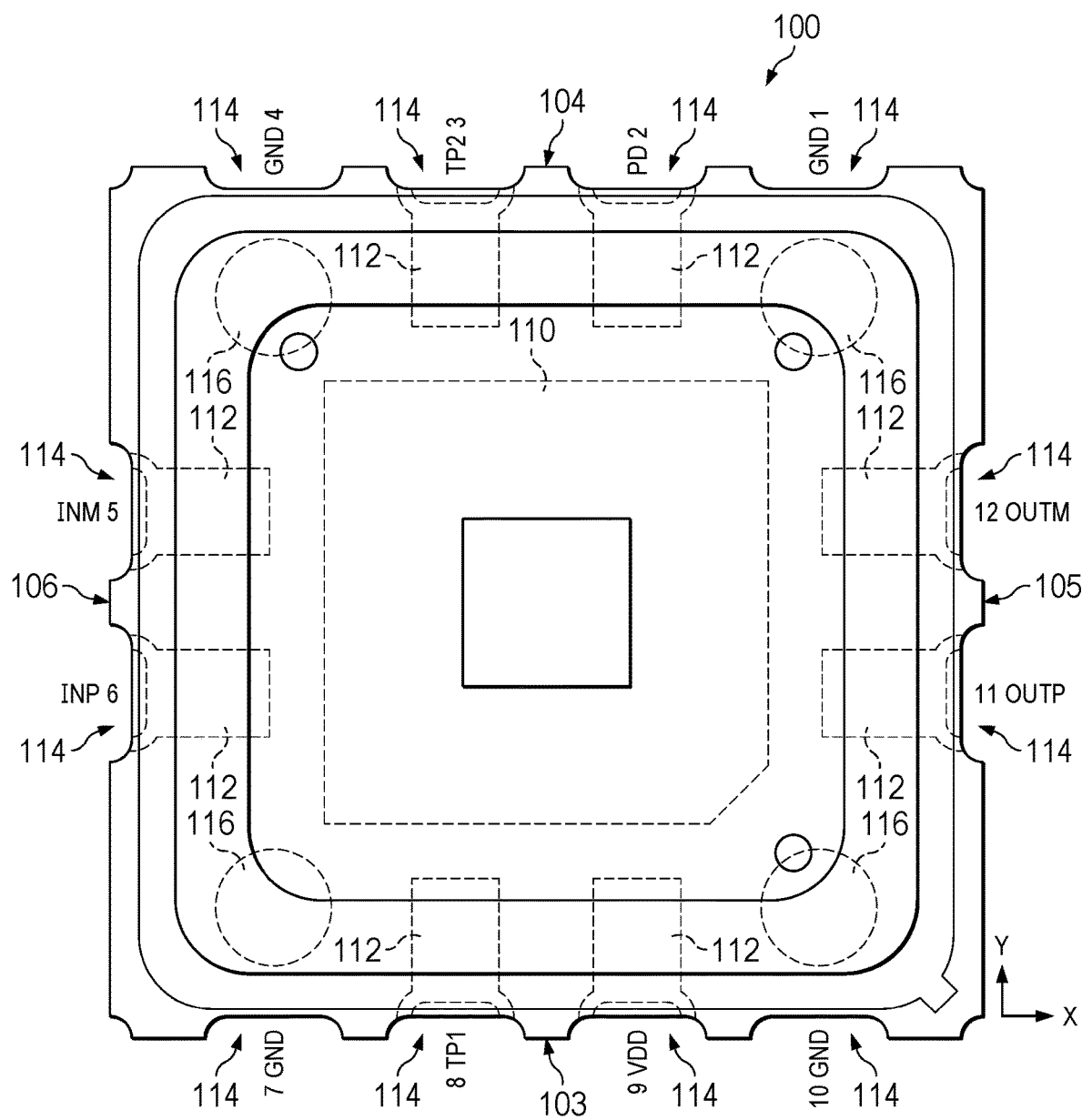
FIG. 1E is a top plan view of the electronic device of FIG. 1.

Referring initially to FIGS. 1-1E, FIG. 1 shows a bottom perspective view of a leadless ceramic chip carrier electronic device 100 with non-conductive indents, FIG. 1A shows a top perspective view of the electronic device 100 and FIG. 1B shows a top perspective view with internal details of the multilevel ceramic package structure of the electronic device 100. FIG. 1C shows a side elevation view with internal details of the multilevel ceramic package structure, FIG. 1D is a schematic system diagram of a high speed amplifier circuit of a semiconductor die of the electronic device of 100 in a high speed system circuit, and FIG. 1E is a top plan view of the electronic device 100.

The electronic device of 100 has a package structure 108 with a rectangular shape including opposite first and second (e.g., bottom and top) sides 101 and 102, respectively, and lateral third, fourth, fifth, and sixth sides 103, 104, 105, and 106, respectively. The electronic device 100 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. In the illustrated orientation, the respective first and second sides 101 and 102 are spaced apart from one another along the third direction Z, the respective third and fourth sides 103 and 104 are spaced apart from one another along the first direction X, and the respective fifth and sixth sides 105 and 106 are spaced apart from one another along the second direction Y.

In one example, the package structure 108 is a multilevel ceramic package structure 108 with multiple laminated levels that define an interior cavity 107 (FIGS. 1A, 1B, and 1C). In another implementation, the package structure includes a laminated substrate structure to provide signal routing and die attach features, such as a multilevel organic substrate, as well as a molded structure (not shown) that encloses the semiconductor die and internal electrical connections. In the illustrated example, the cavity 107 extends to an opening in the second side 102. As best shown and FIGS. 1B and 1C, the ceramic package structure 108 has eight lamination layers or levels, each including a ceramic layer L1, L2, L3, L4, L5, L6, L7, and L8 (FIG. 1C) and a respective patterned conductive metal trace layer T1, T2, T3, T4, T5, T6, T7, and T8 formed thereon, as well as a bottom patterned conductive metal trace layer T0. Any suitable metal material can be used for the trace layers T0-T8, for example, a metal that is or includes copper (Cu), aluminum (Al), tungsten (W), molybdenum (Mo), etc., or combinations thereof. The top trace layer T8 in this example includes or connects to a conductive metal rectangular structure 109 (FIGS. 1A-1C) that encircles the opening 107 of the second side 102 of the package structure 108 to allow connection of a lid to seal the cavity 107.

As further shown in FIGS. 1B and 1C, conductive metal vias V1, V2, V3, V4, V5, V6, V7, and V8 extend through the respective ceramic layers L1-L8 at select locations to form electrical connections between levels of the multilevel ceramic package structure 108. Any suitable metal material can be used for vias V1-V8, for example, a metal that is or includes copper, aluminum, tungsten, molybdenum, etc., or combinations thereof.

In one example, the multilevel package structure 108 also includes a conductive metal thermal pad 110 (e.g., FIGS. 1, 1B, and 1E) having a planar side exposed along the first side 101 of the ceramic package structure 108. The thermal pad 110 can facilitate removal of heat during powered operation of the electronic device 100 and/or may provide an electrical connection to a host PCB to which the electronic device 100 is connected (not shown), for example, a circuit ground or reference connection.

The electronic device 100 also includes conductive metal terminals 112 formed as part of the patterned bottom trace level T0. The individual conductive metal terminals 112 have respective planar sides exposed along the first side 101 of the ceramic package structure 108 for soldering to corresponding conductive pads of a host PCB.

The electronic device 100 includes non-conductive indents 114 extending into the respective third, fourth, fifth, and sixth sides 103, 104, 105, and 106. In other example, the electronic device 100 may have a non-conductive indent 114 along only one of the lateral sides 103-106, or one or more non-conductive indents 114 can extend into fewer than all of the sides 103-106. At least one of the conductive metal terminals 112 extends to a corresponding one of the non-conductive indents 114. The illustrated example has non-conductive indents 114 along each of the sides 103-106, and a conductive metal terminal 112 extends to each respective one of the non-conductive indents 114. In one example, the non-conductive indents 114 are unplated castellations that extend into the corresponding one of the lateral sides 103-106 of the ceramic package structure 108. The non-conductive castellation indents 114 in one example are formed as holes in each ceramic lamination layer L1-L8 with no plating or conductive metal, and the castellation holes are subsequently saw or laser cut to form unplated non-conductive arcuate concave indented shapes (e.g., FIG. 1E) that extend into a respective one of the lateral sides 103-106 and extend along the third direction Z from the first (e.g., bottom) side 101 to the second (e.g., top) side 102 in the orientation shown in the drawings.

In other implementations, the non-conductive indents 114 need not extend all the way to the sides 101, 102. In some examples, the electronic device can also include one or more conductive (e.g., plated) castellations and corresponding conductive terminals, for example, as illustrated and described further below in connection with FIGS. 3 and 3A.

As shown in FIGS. 1A-1C, the electronic device 100 also includes conductive pins 116 spaced apart from the conductive terminals 112 and extending outward from the first side 101 of the ceramic package structure 108 along the third direction Z. In one implementation, the pins 116 are or include one or more conductive metals, such as copper, aluminum, etc., and are brazed to corresponding locations of the bottom trace T0 with a tapered braze joint 118 as shown in FIGS. 1A-1C. In one example, the pins 116 are cylindrical pogo pins having a diameter of approximately 0.305 mm and the braze joint has a diameter of approximately 0.850 mm and a braze height along the third direction Z of approximately 0.28 mm. The pins 116 facilitate suitable solder connection and laterally aligned attachment of the electronic device 100 to a host PCB (not shown) with good board level reliability, for example, and provide at least partial compensation for the lack of conductive solder connection to the non-conductive indents 114. In one example, the pins 116 are located proximate the corners of the first side 101 of the electronic device 100, and the device 100 is a hybrid LCCC with only external connection changes to use the non-conductive indents 114 and the bottom side pins 116, for example, using a corner pin structure from production CPGA FYF package constructions or the like to provide hybrid surface mount technology (SMT) and through-hole pin assembly with no changes to the silicon-package interface and internal substrate layout of the package structure 108.

As shown in FIGS. 1A-1C, the electronic device 100 also includes a semiconductor die 120 in the cavity 107. In one example, the semiconductor die 120 has conductive metal features, such as copper studs, solder balls, etc. along a bottom side thereof, and is flip chip attached (e.g., by conductive solder or conductive adhesive, not shown) to corresponding trace features of the patterned metal trace layer T5 as shown in FIG. 1C. This provides power and signal routing between a circuit of the semiconductor die 120 and respective terminals 112 of the electronic device through conductive routings of the traces and vias of the multilevel ceramic package structure 108. In another implementation, bond wires (not shown) can be used for some or all of the electrical connections between the package structure 108 and the semiconductor die 120. The electronic device 100 in some implementations can include other dies and/or passive components (e.g., capacitors, resistors, inductors, transformers, etc., not shown) within the package structure 108 (e.g., inside the cavity 107), with suitable electrical circuit connections.

As further shown in FIGS. 1A-1C, moreover, the electronic device 100 includes a lid 122, such as a planar rectangular metal plate (e.g., copper, aluminum, etc.) that covers the opening 107 and seals the cavity 107. In one implementation, the electronic device 100 is a military or space rated circuit component with a vacuum sealed cavity 107 that houses the semiconductor die 120 within the ceramic package structure 108 that provides environmental protection for the included circuitry.

The semiconductor die 120 can include any type and form of electrical circuitry. FIGS. 1D and 1E show a high speed amplifier example of the electronic device 100. FIG. 1D illustrates a system 130 including this implementation of the electronic device 100 with a high speed amplifier (HAS) circuit 131 in the semiconductor die 120 of the electronic device of 100. In one example, the system 130 includes a high speed system circuit with an AC signal source, an output filter and an analog to digital converter (ADC). FIG. 1E shows a top view of the electronic device 100 including signal designations and pin/terminal numbers for the high speed amplifier circuit 131, and the schematic diagram of FIG. 1D includes the corresponding terminal numbers of the electronic device 100.

The high speed amplifier circuit 131 has a differential amplifier input that includes a plus input 132 capacitively coupled to the AC signal source in FIG. 1D (e.g., pin number 6, labeled INP in FIG. 1E) and a minus input 133 capacitively coupled to a circuit ground GND in FIG. 1D (e.g., pin number 5 labeled INM in FIG. 1E). The circuit 131 also has a differential output that includes a plus output 134 capacitively coupled in FIG. 1D to a filter circuit and the ADC (pin number 11 labeled OUTP in FIG. 1E) and a minus output 135 capacitively coupled in FIG. 1D to the filter and ADC (pin number 12 labeled OUTM in FIG. 1E). The circuit 131 of the electronic device 100 also has a power down signal input 136 in FIG. 1D (pin number 2 labeled PD in FIGS. 1D and 1E) and a supply voltage input 137 in FIG. 1D (pin number 9 labeled VDD in FIGS. 1D and 1E). In this example, the high speed amplifier circuit 131 has ground or other circuit reference node connections (138 and FIG. 1D) at the pins 116 (pin numbers 1, 4, 7, and 10 labeled GND in FIGS. 1D and 1E) that are electrically coupled to a ground or reference node of the circuit 131 of the semiconductor die 120, as well as optional test pins at pin numbers 3 and 8 labeled TP2 and TP1, respectively, in FIG. 1E.

Figure 2:
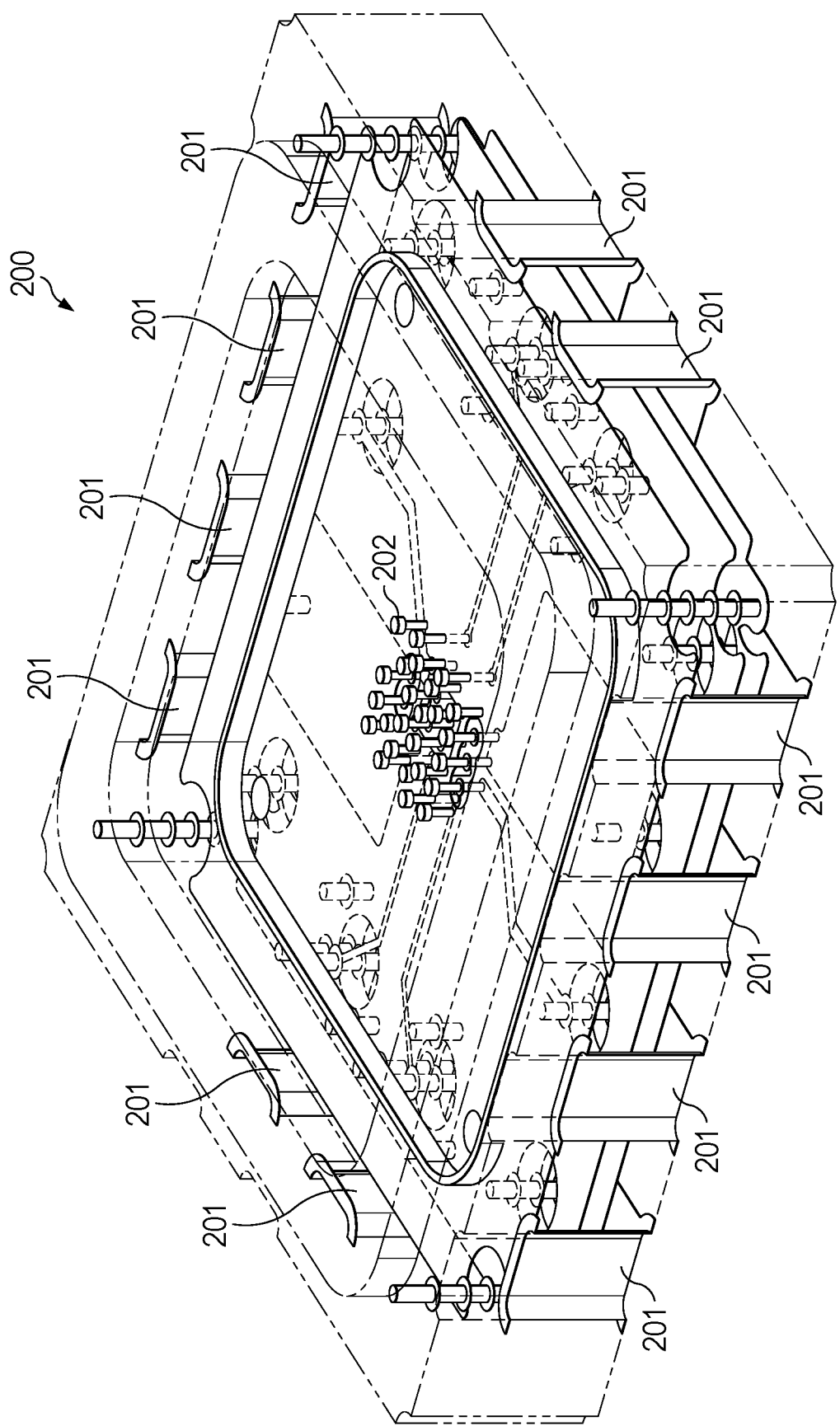
FIG. 2 is a top perspective view showing internal details of an LCCC electronic device with conductive plated castellations.
Figure 2B:
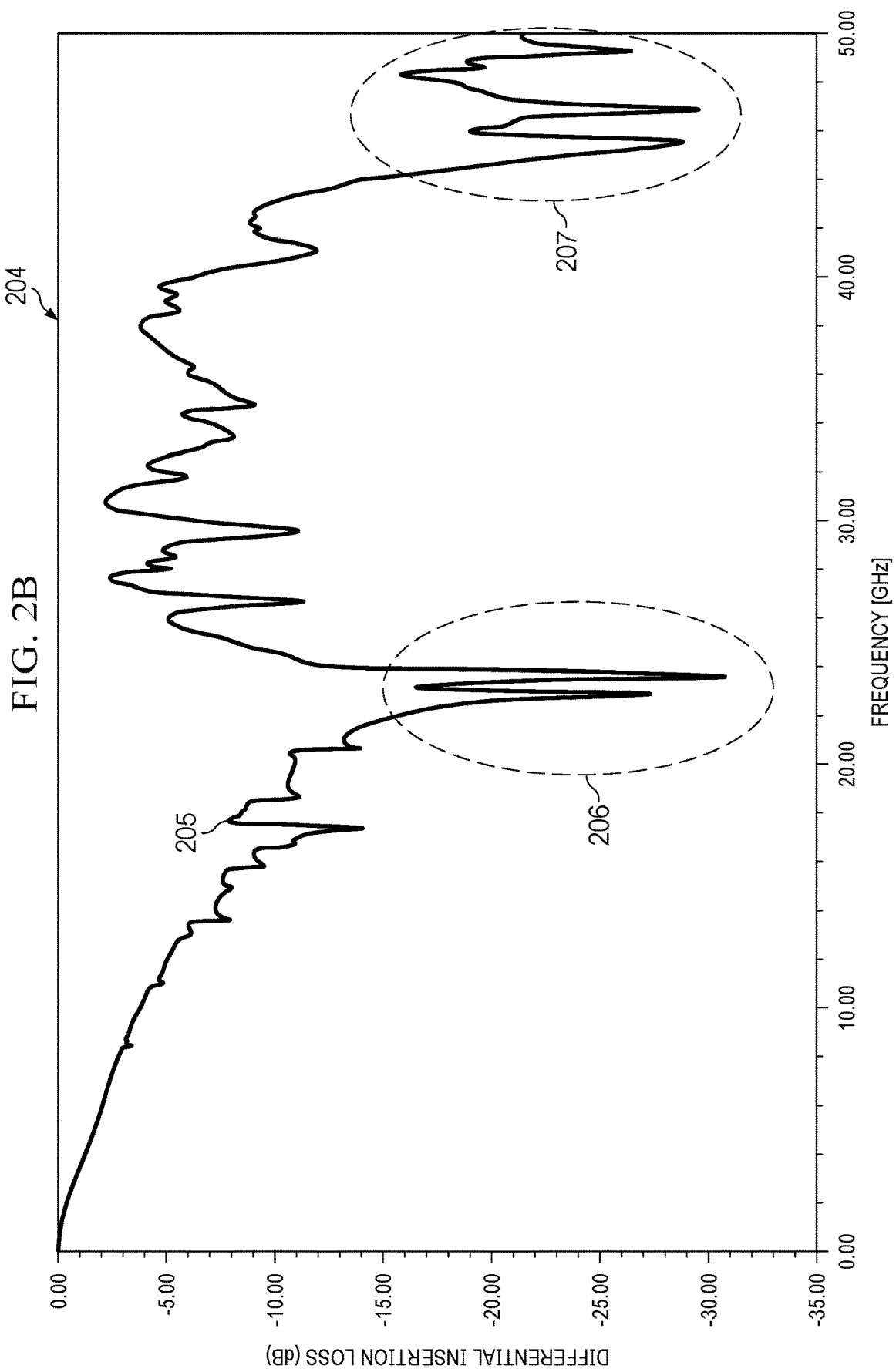
FIG. 2B is a graph of differential insertion loss performance of a high-frequency signal connection in the electronic device of FIG. 2.
Figure 2C:
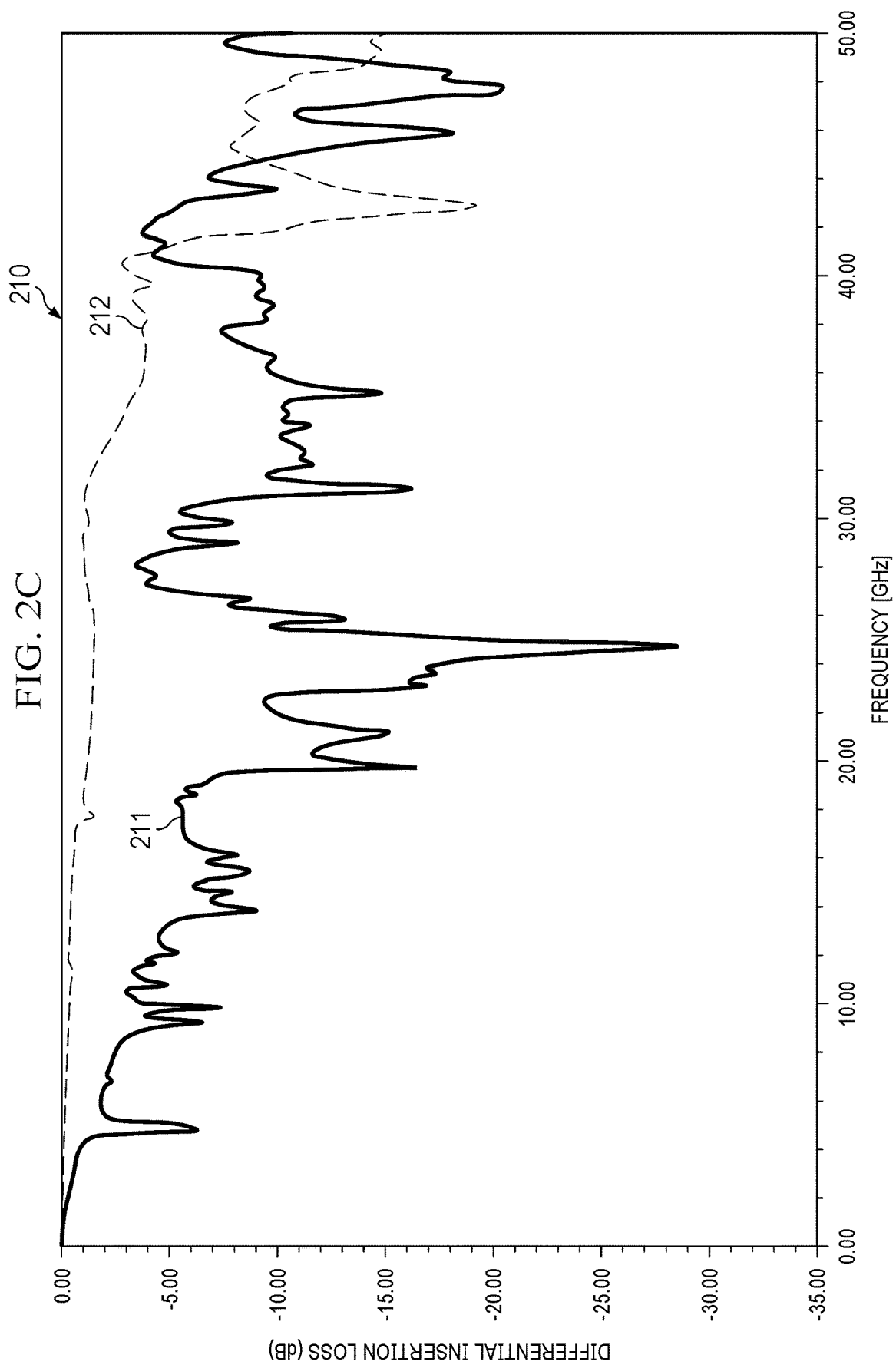
FIG. 2C is a graph with curves illustrating comparative differential insertion loss performance of high-frequency signal connections in the electronic devices of FIGS. 1 and 2.
Figure 2D:
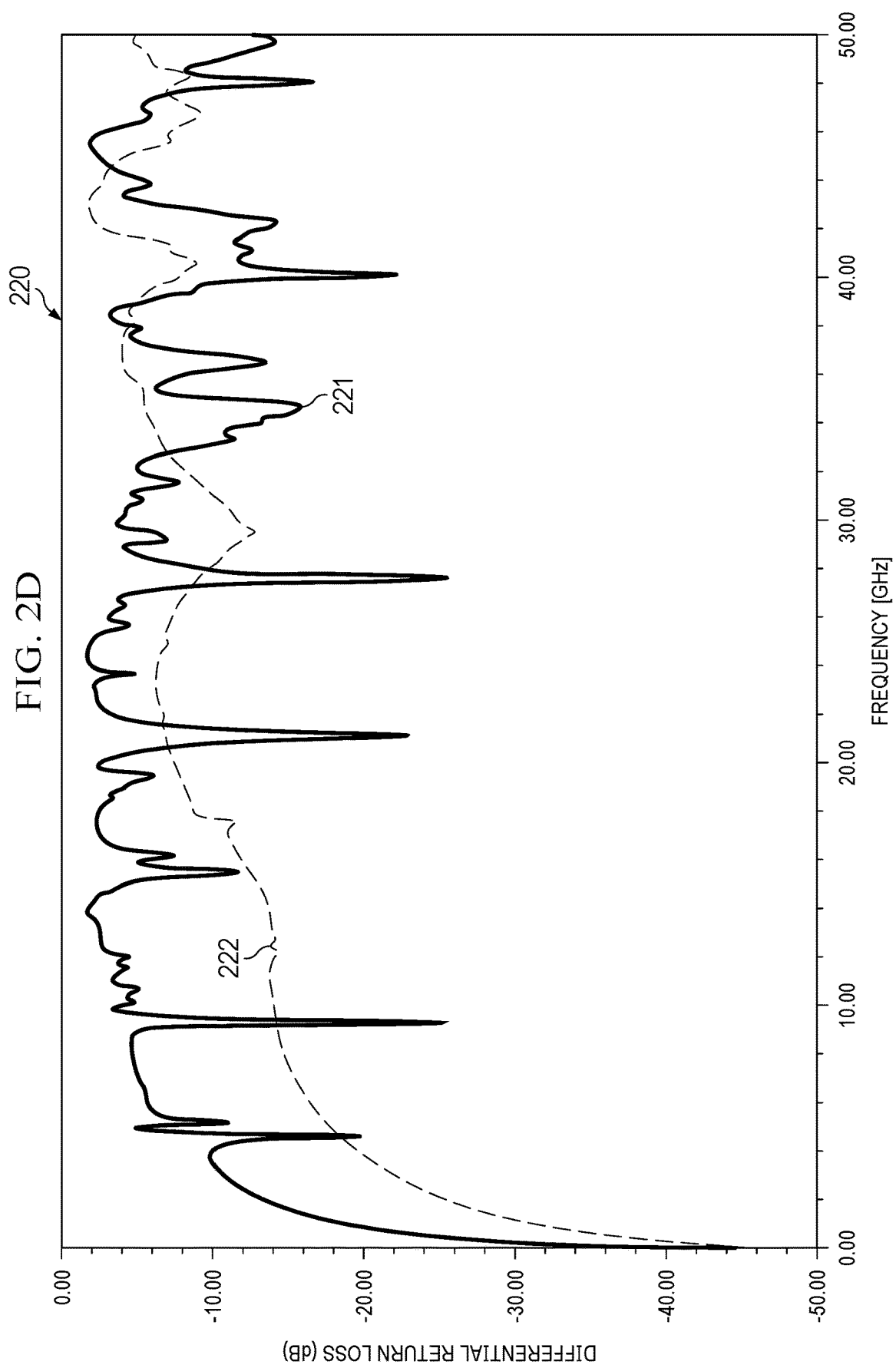
FIG. 2D is a graph with curves illustrating comparative differential return loss performance of high-frequency signal connections in the electronic devices of FIGS. 1 and 2.

Referring also to FIGS. 2-2D, the provision of the conductive pins 116 and the use of the non-conductive indents 114 of the electronic device 100 of FIGS. 1-1E advantageously facilitates board level reliability while mitigating or avoiding the antenna effects for high frequency operation of the electronic device 100 and provides significant circuit operational advantages compared with conductive castellations for high frequency circuit terminal connections. As discussed above, the through hole conductive pins 116 help ensure suitable alignment and mechanical connection or attachment of the electronic device 100 to a host PCB. FIGS. 2 and 2A a show another LCCC device 200 with conductive (e.g., metal plated) castellations 201 along the lateral side walls, where the metal castellations 201 are mechanically and electrically connected to corresponding conductive terminals along the bottom side of the device 200. As shown in FIG. 2A, moreover, a high frequency signal line in the substrate of the device 200 beginning at a metal via or trace feature 202 that can be connected (e.g., by conductive solder or conductive adhesive, not shown) to a circuit of an attached semiconductor die (not shown) and extending to the conductive metal castellation 201 creates a quarter wave antenna structure that can adversely affect high-frequency signals during operation the device 200.

FIG. 2B shows a graph 204 with a curve 205 that illustrates differential insertion loss performance of a high-frequency signal connection in the electronic device 200 of FIGS. 2 and 2A. The differential insertion loss shown by the curve 205 includes significant residence affects at valleys 206 and 207 as shown in FIG. 2B.

FIGS. 2C and 2D show comparative graphs that illustrate the advantages and benefits of the non-conductive indents 114 in the electronic device 100 of FIGS. 1-1D, particularly for high frequency signals above 5 GHz. In this example, the conductive terminals 112 of the high frequency signal lines of the high speed amplifier circuit 131 of the semiconductor die 120 extend to corresponding non-conductive indents 114 along the third and fourth sides 103 and 104 of the electronic device 100. As used herein, a high-frequency signal line is a conductive structure of an electronic device connected to a semiconductor die input or output terminal configured to convey or carry an electrical signal, such as a current or voltage, at a frequency of 5 GHz or more, when the semiconductor die is powered and operating, and a non-high-frequency signal line is a conductive structure connected to a semiconductor die input or output terminal configured to convey or carry an electrical signal, such as a current or voltage, at a frequency of 5 GHz or less.

FIG. 2C shows a graph 210 with curves 211 and 212 that illustrate differential insertion loss performance of high-frequency signal connections in the electronic devices of FIGS. 2 and 1, respectively. The curve 211 in FIG. 2C shows the differential insertion loss for the electronic device 200, including significant negative peaks for operation at 5 GHz or more, whereas the curve 212 shows significantly improved insertion loss performance of the electronic device 100 that uses the non-conductive indents 114 at the conductive terminals 112 associated with the high speed amplifier inputs and outputs (e.g., pin numbers 5, 6, 11, and 12) along the respective third and fourth sides 103 and 104 as shown in FIGS. 1-1C and 1D above.

Further benefits are seen in FIG. 2D with respect to differential return loss. A graph 220 in FIG. 2D includes a curve 221 showing the differential return loss performance of the electronic device 200 of FIGS. 2 and 2A with significant valleys for high frequencies of 5 GHz or more, whereas a curve 222 shows the differential return loss performance for the electronic device 100 with the non-conductive indents 114 at the high speed amplifier input and output terminals. The non-conductive indents 114 of the electronic device 100 help to mitigate or avoid undesirable antenna effects associated with plated or other conductive castellations as used in the electronic device 200.

Figure 3:
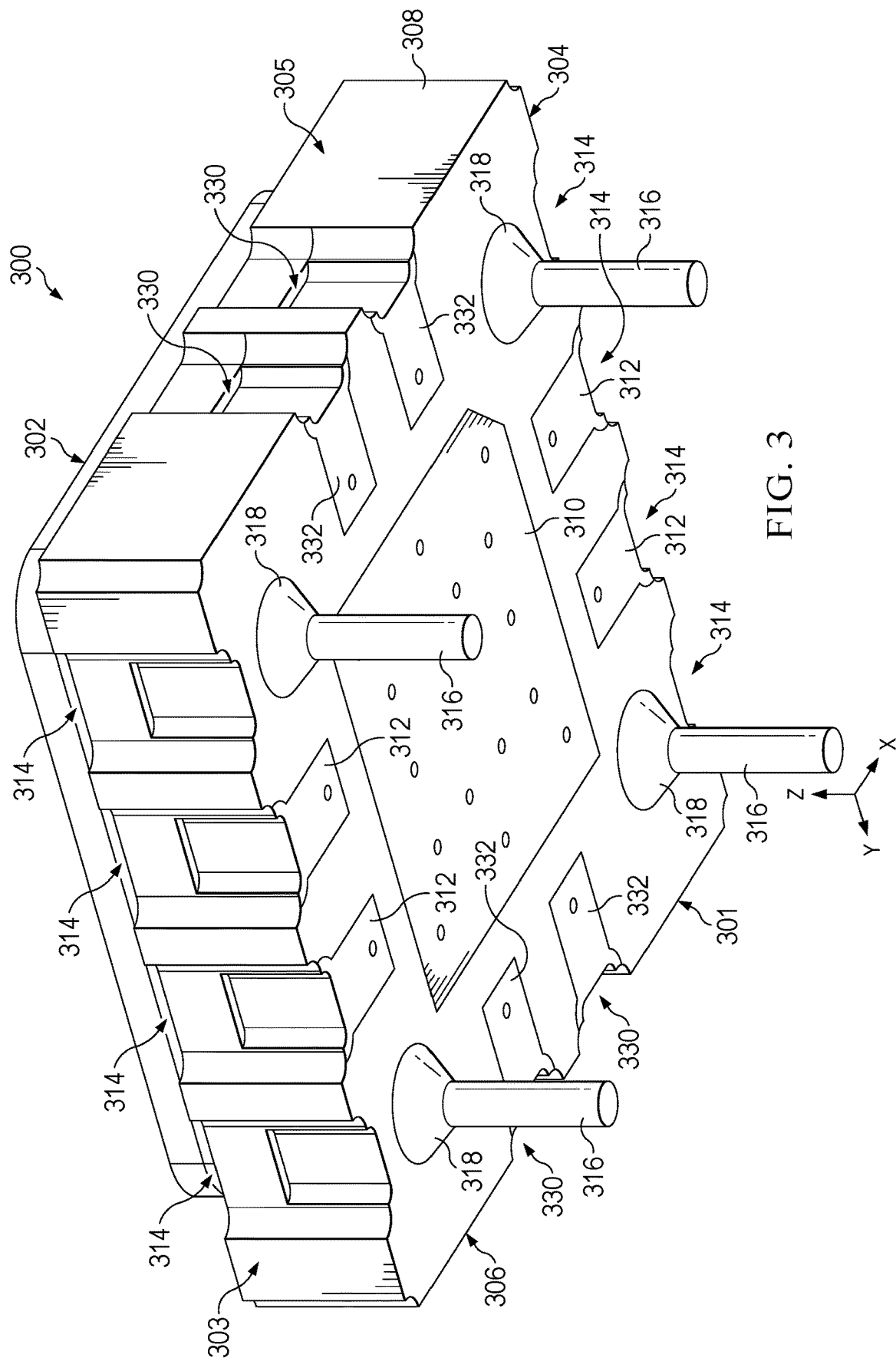
FIG. 3 is a bottom perspective view of another leadless ceramic chip carrier electronic device with non-conductive indents for high-frequency signal terminals and conductive indents for non-high-frequency signal terminals.
Figure 3A:
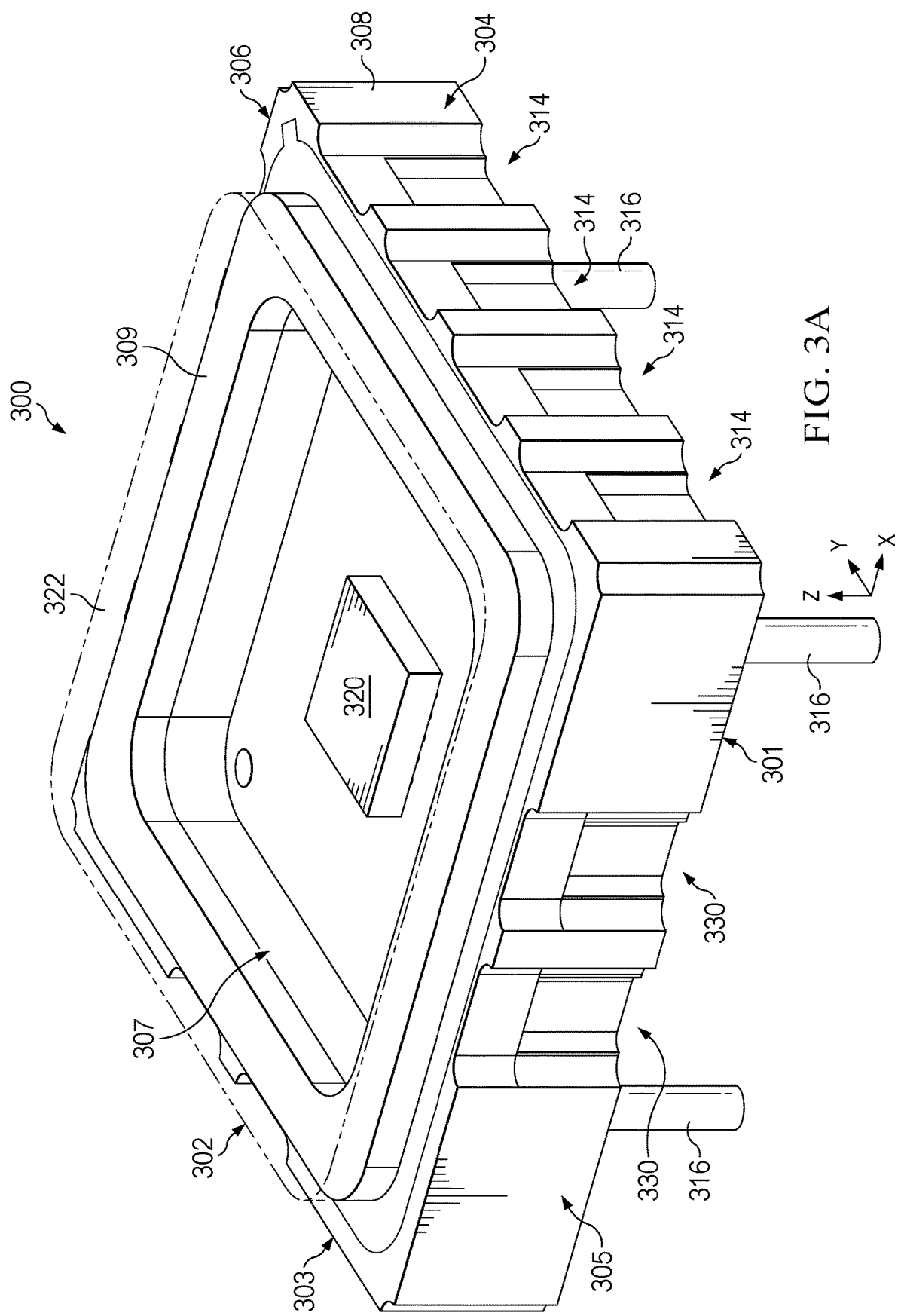
FIG. 3A is a top perspective view of the electronic device of FIG. 3.

FIGS. 3 and 3A show another example leadless ceramic chip carrier electronic device 300 having one or more high-frequency signal lines of an included circuit connected to non-conductive terminals 312 that extend to non-conductive indents 314 to mitigate adverse antenna effects as discussed above in connection with the example electronic device 100 of FIGS. 1-1E. The electronic device 300 is similar in some respects, but also includes certain conductive (e.g., metal plated) castellations or conductive indents 330 that extend to corresponding second conductive terminals 332 along the bottom of the electronic device 300. In this example, the second conductive terminals 332 are electrically coupled to a non-high frequency signal lines of the circuit of an included semiconductor die 320 and extend to the corresponding conductive indents 330.

The electronic device of 300 has a laminated multilevel ceramic package structure 308 with a rectangular shape including opposite first and second sides 301 and 302, respectively, and lateral third, fourth, fifth, and sixth sides 303, 304, 305, and 306, respectively, as well as an interior cavity 307 that extends to an opening in the second side 302 and includes a semiconductor die 320. The electronic device 300 is shown in an example position or orientation in a three-dimensional space with mutually orthogonal first, second, and third directions X, Y, and Z, respectively. A top trace layer includes or connects to a conductive metal rectangular structure 309 that encircles the opening of the cavity 307 to allow connection of a lid 322 to seal the cavity 307. In one example, the multilevel package structure 308 also includes a conductive metal thermal pad 310 (e.g., FIG. 3) having a planar side exposed along the first side 301 of the ceramic package structure 308.

The electronic device 300 also includes conductive metal terminals 312 and 332 formed as part of the patterned bottom trace level. The individual conductive metal terminals 312 have respective planar sides exposed along the first side 301 of the ceramic package structure 308 for soldering to corresponding conductive pads of a host PCB and (not shown). In addition, the electronic device 300 includes non-conductive indents 314 extending into the respective third and fourth sides 303 and 304, respectively, as well as conductive castellations or indents 330 along the fifth and sixth sides 305 and 306, respectively. In this example, the conductive metal terminals 312 extend to corresponding ones of the non-conductive indents 314 for the high frequency signals (e.g., high speed amplifier input and output signals INP, INM, OUTP, and OUTN in a high speed amplifier implementation as described above in connection with FIG. 1E). The conductive metal terminals 332 extend to corresponding ones of the conductive indents 330 along the sides 305 and 306 for the non-frequency signals (e.g., power, ground, and test pin signals PD, VDD, GND, TP1, TP2 in FIG. 1E). The selective use of one or more conductive indents 330 helps facilitate board level reliability in combination with the use of conductive pins 316 connected by BRAZE connections 318 and spaced apart from the conductive terminals 312 that extend outward from the first side 301 of the ceramic package structure 308 along the third direction Z. In this example, moreover, the conductive indents 330 are only associated with non-high frequency signal terminals 332, whereas the high-frequency I/O signals of the high speed amplifier example are electrically coupled to the conductive metal terminals 312 that extend to corresponding non-conductive indents 314 to avoid or mitigate the adverse antenna effects on the high-frequency signals of the electronic device 300.

Referring also to FIGS. 4-10, FIG. 4 shows a method 400 of fabricating an electronic device, and FIGS. 5-10 show the electronic device 100 undergoing fabrication processing according to the method 400. The method 400 begins with ceramic raw material at 402 in FIG. 4, which is cast onto a carrier tape sheet at 404 and cut into a panel at 406.

A multilevel lamination process 407 is used in one example to create the laminated eight level structure 108 described above in connection with FIGS. 1B and 1C. For each level (e.g., level L1 in FIG. 5), a ceramic material panel is framed at 408, and one or more via holes are punched in one layer at 410. This can include punching holes in prospective castellation positions for subsequent processing and cutting along the final structure sides to form the non-conductive indents as well as any included conductive indents. In this or another example, the processing at 410 can include punching partial holes or other edge indentations, for example, to form unplated, non-conductive indent features 114 along prospective sides of the currently processed level of the package structure.

One or more vias and non-high-frequency castellation holes are filled at 412 with conductive metal material, for example, that is or includes copper (Cu), aluminum (Al), tungsten (W), molybdenum (Mo), etc., or combinations thereof. In one example, select ones of the holes are fully filled. In another example, the holes are partially filled, for example, using a plating or other deposition process that forms a metal coating along the sides of select ones of the holes. This forms the conductive vias (e.g., V1 in FIG. 5) and any desired conductive castellation indents for the currently processed level (e.g., L1), without forming metal along the sides of holes or indent features of any of the prospective non-conductive indents 114.

At 414, a patterned deposition is performed, such as a silkscreen printing process to form a patterned conductive trace layer (e.g., T1) for the currently processed level (e.g., L1). In one example, the bottom patterned metal trace layer (T0) is silkscreen printed on the bottom side, followed by printing the first trace layer T1 on the top side of the first processed ceramic layer L1.

Figure 5:
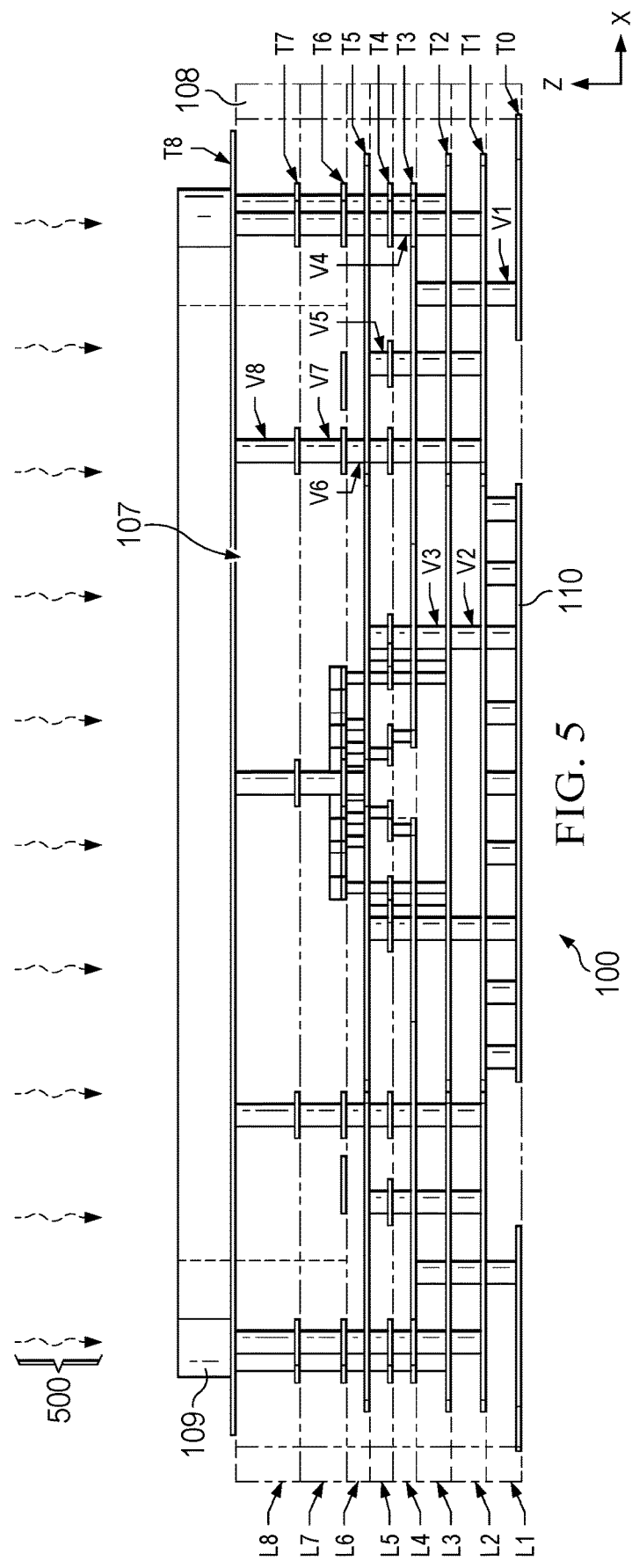
FIGS. 5-10 are side elevation views of the electronic device of FIG. 1 undergoing fabrication processing according to the method of FIG. 4.

The currently processed level is laminated onto any preceding level at 416, and the processing at 407 is then repeated at 418 for each successive level, to produce the structure shown in FIG. 5 with the package structure features described above in connection with FIGS. 1B and 1C, including formation of the conductive metal rectangular structure 109 surrounding the opening to the cavity 107 on the top second side 102 of the package structure 108.

Once all the desired lamination levels are created at 407, the method 400 continues at 420 with unit patterning (e.g., snapping) to define unit boundaries between concurrently processed units of a panel array with rows and columns of unit areas, and then unit separation from the panel array at 422. At 424, the method 400 further includes co-firing the ceramic material. FIG. 5 shows one example, in which a heating process 500 is performed that co-fires the multilevel laminated ceramic package structure 108 to seal the levels to one another.

Figure 4:
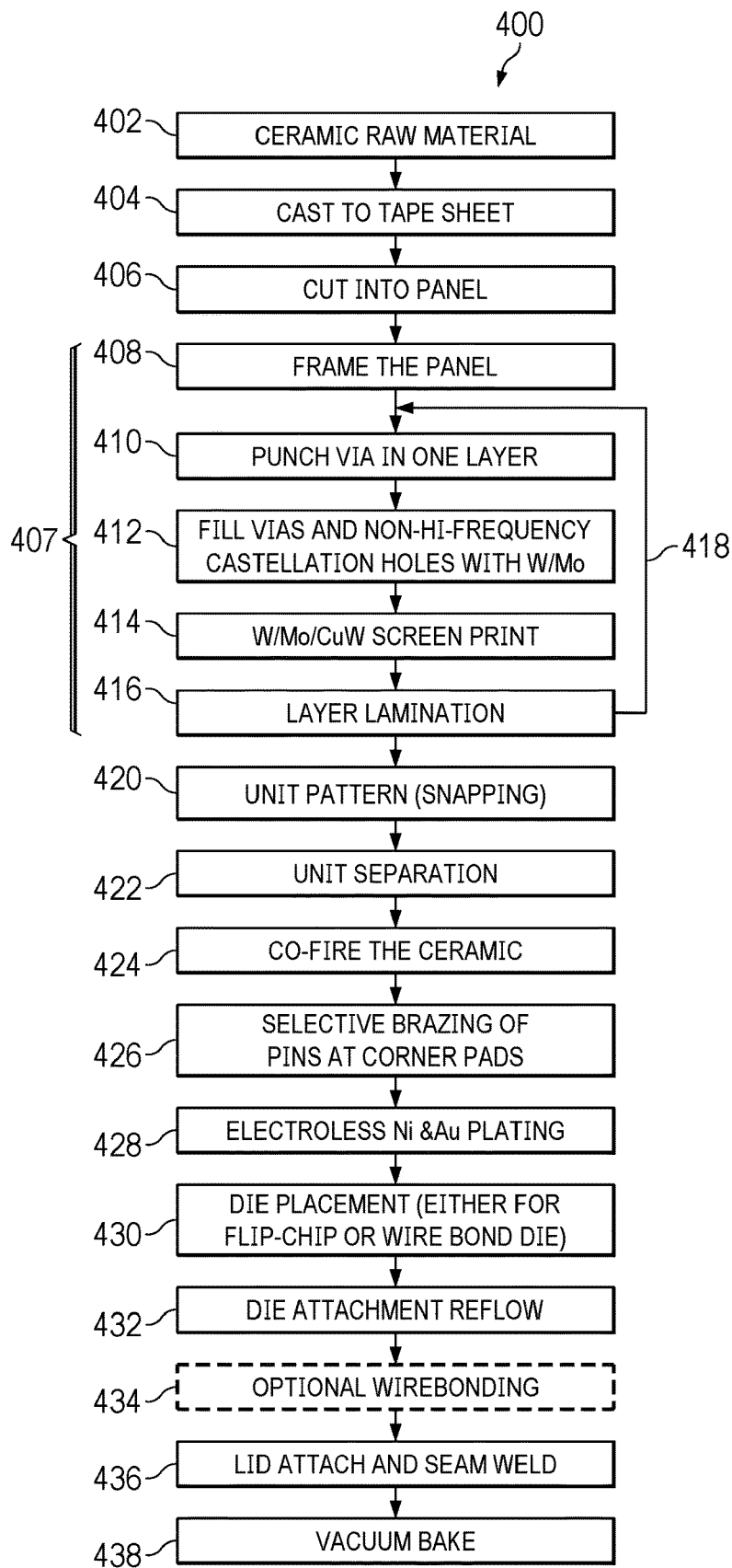
FIG. 4 is a flow diagram of a method of fabricating an electronic device.
Figure 6:
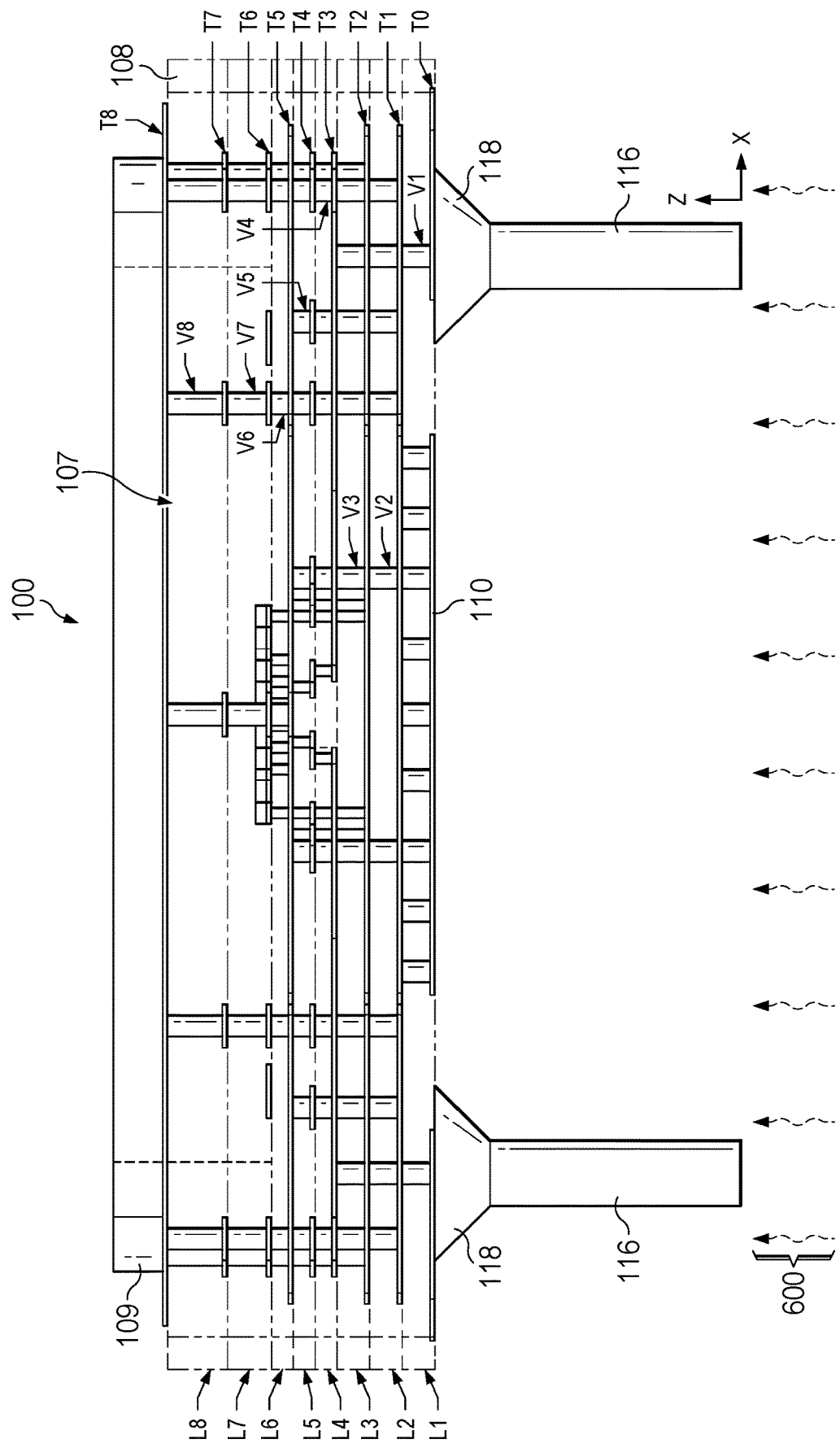

The method 400 includes selective brazing or other pin attachment processing at 426 in FIG. 4 to attach the pins 116 to the bottom or first side 101 of the package structure 108. FIG. 6 shows one example, in which a brazing process 600 is performed that attaches the pins 116 to corresponding locations of the bottom trace layer T0 of the package structure 108 with a tapered braze joint 118. In one example, the pins 116 are brazed at 424 to conductive trace feature locations proximate the corners of the bottom first side 101 of the electronic device 100 to create a hybrid LCCC package. The brazing process 600 in one example forms the conductive pins 116 spaced apart from the conductive terminals 112 and extending outward from the first side 101 of the ceramic package structure 108 along a third direction Z.

Figure 7:
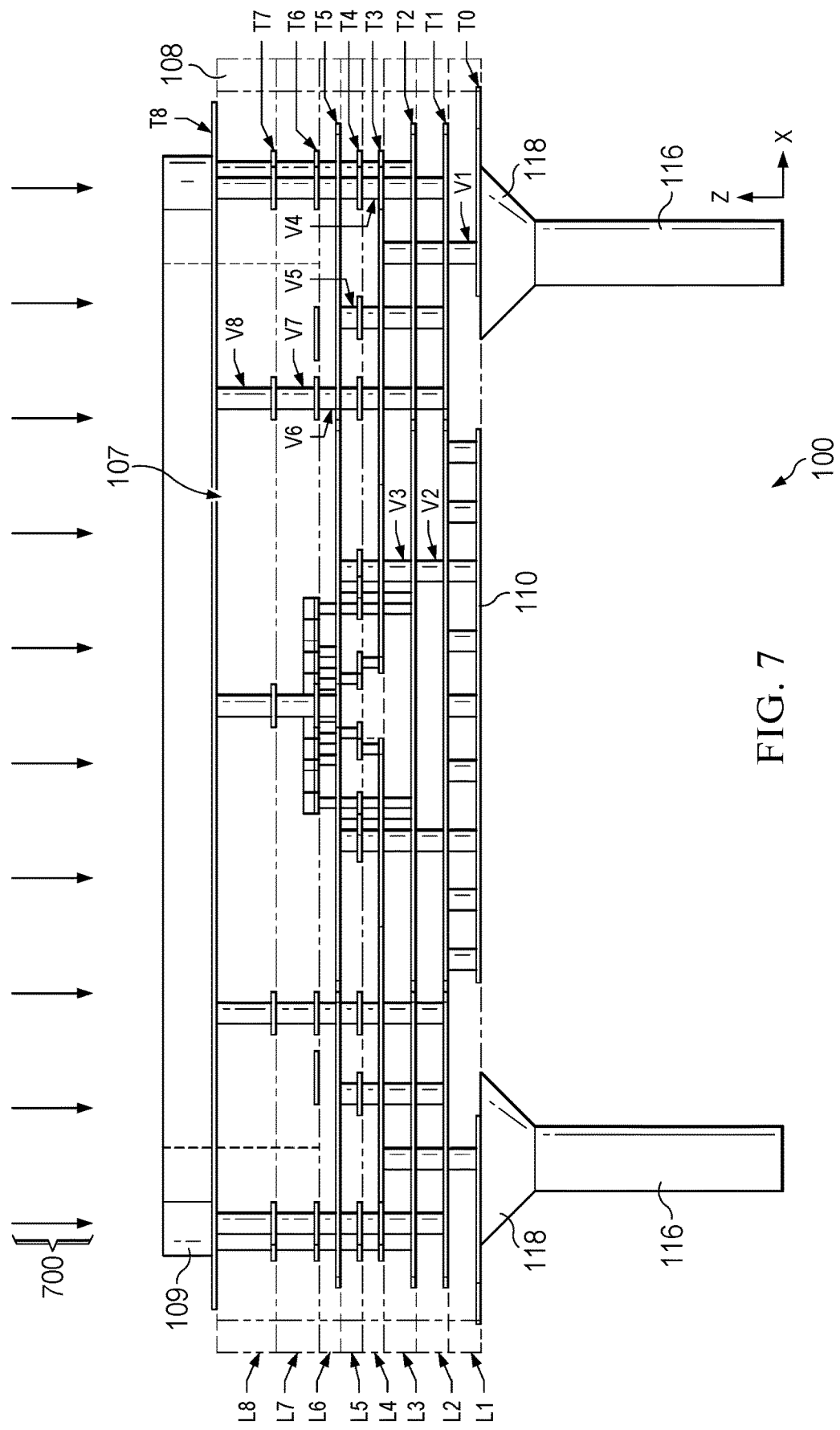

The method 400 continues at 428 in FIG. 4 with optional plating operations. FIG. 7 shows one example, in which a plating process 700 is performed that plates exposed conductive metal surfaces of the structure with one or more materials, such as nickel (Ni) and/or gold (Au) using electroless plating.

At 430 in FIG. 4, the method 400 also includes die attachment or placement as well as electrical connection processing at 432. The illustrated example, the die attachment at 430 and electrical connection processing at 432 is a flip chip process that includes die placement at 430 with conductive terminals of the semiconductor die 120 engaging corresponding conductive structures (e.g., metal traces and/or conductive metal vias) of one or more levels of the multilevel package structure 108 within the cavity 107 thereof, followed by curing at 432.

In one implementation, solder paste is selectively deposited through any suitable printing, screening or other process on the conductive features of the package structure 108 in the cavity 107, and the semiconductor die 120 is placed (e.g., using automated pick and place equipment, not shown) with metal (e.g., copper) pillars of the semiconductor die 120 contacting the previously deposited solder paste. In another flip chip attachment implementation at 430, the conductive metal pillars of the semiconductor die 120 are dipped in liquid or semiliquid solder, and the semiconductor die 120 is then placed with the solder-dipped metal pillars engaging the desired conductive features of the package structure 108 in the cavity 107. In another possible implementation, conductive adhesive is applied to the conductive features of the package structure 108 in the cavity 107, followed by die attachment at 430.

Figure 8:
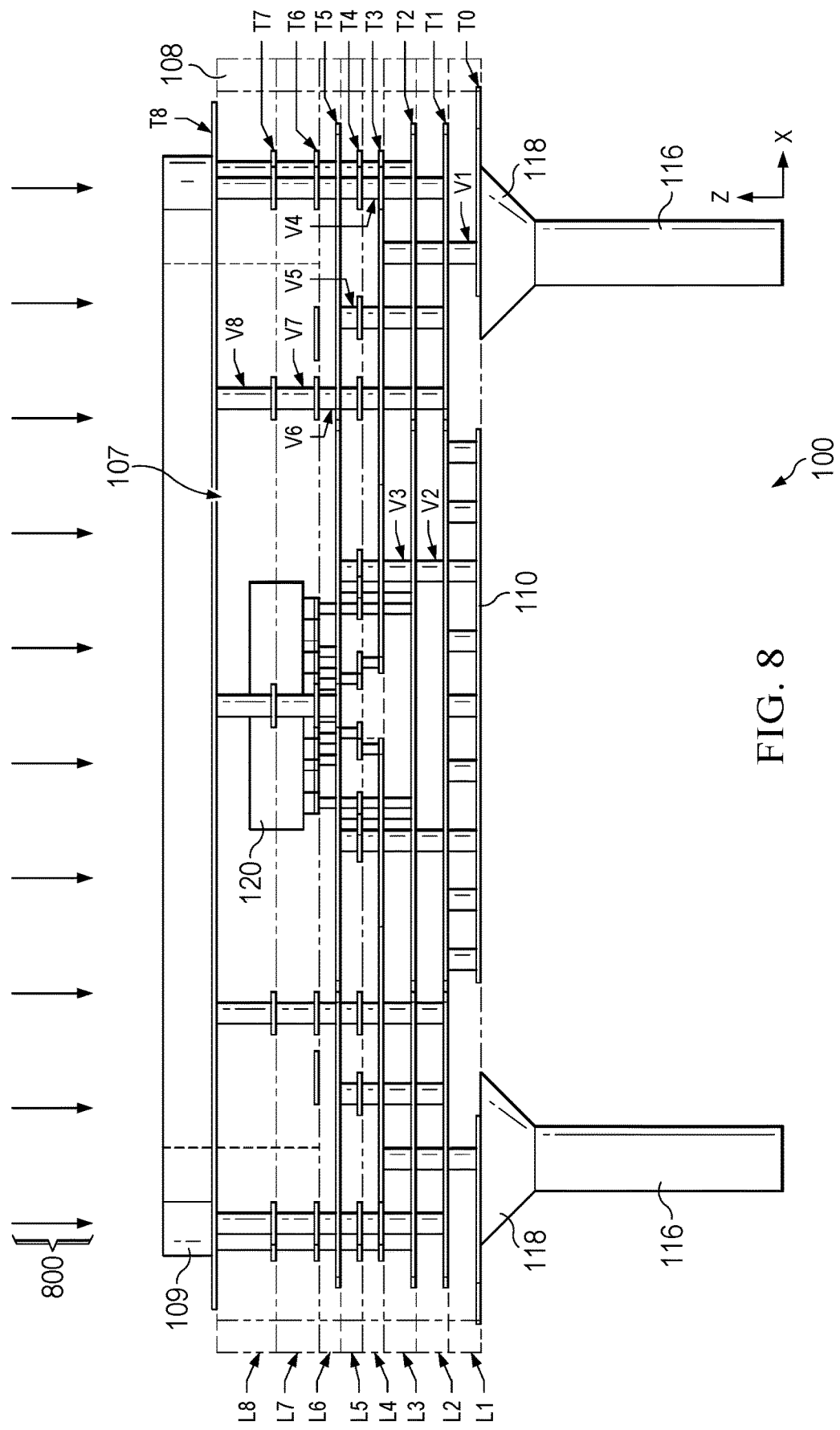

FIG. 8 shows one example, in which a die attach process 800 is performed that attaches the semiconductor die 120 to engage copper pillars of the semiconductor die 120 to the corresponding conductive features of the package structure 108 in the cavity 107, using either solder paste or conductive adhesive (not shown).

Figure 9:
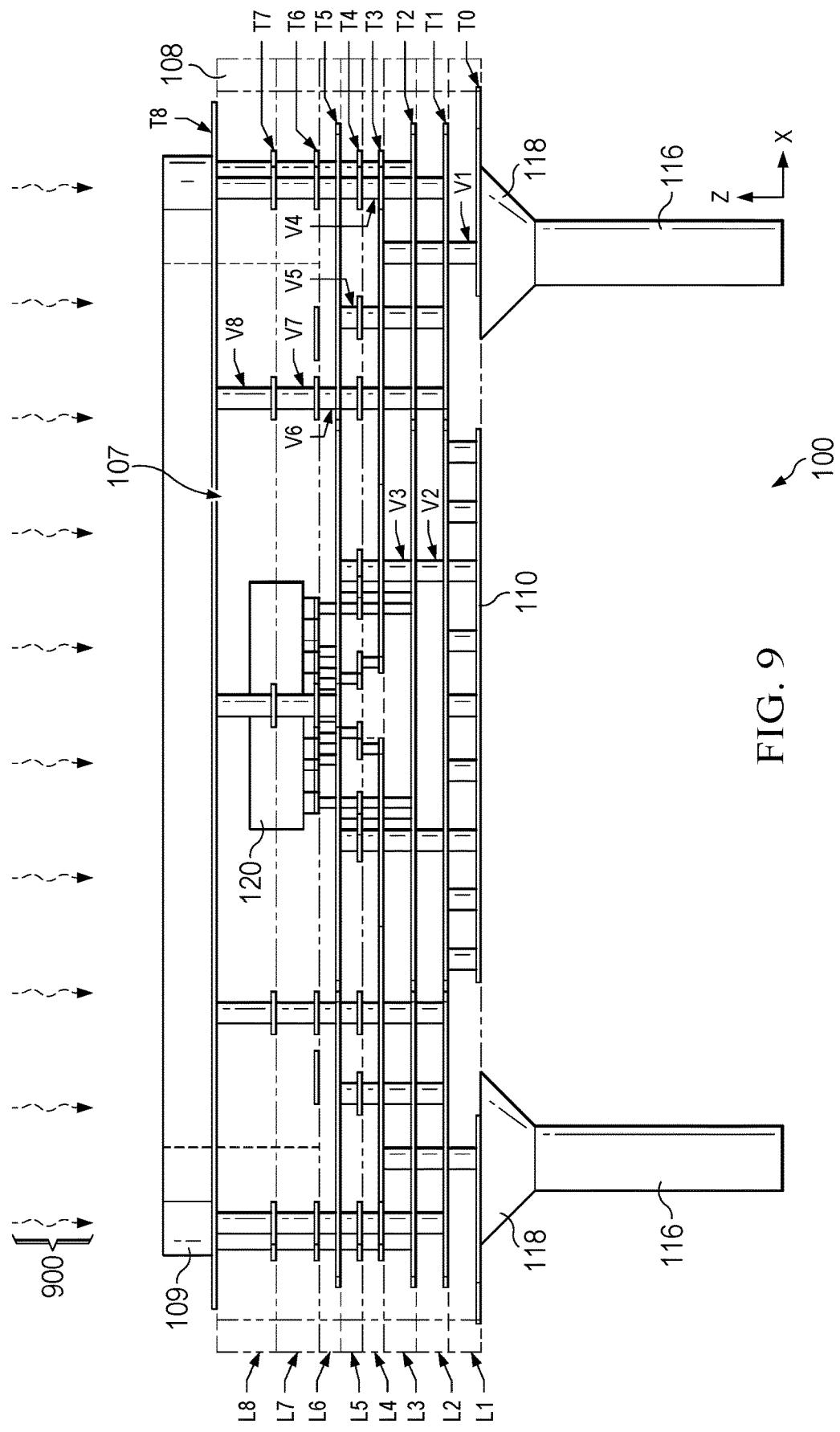

In this example, the electrical connection at 432 includes a curing process that reflows the solder or activates the conductive adhesive to complete the electrical connections between the conductive pillars of the semiconductor die 102 and the conductive features of the package structure 108 in the cavity 107. FIG. 9 shows one example, in which a thermal reflow process 900 is performed that reflows the solder to form the electrical connections. In another implementation, the process 900 is a thermal or optical (e.g., UV) process that cures a conductive adhesive to complete the electrical connections of the circuit of the semiconductor die 120 with the conductive routing structures of the multilevel ceramic package structure 108 in the cavity 107. One of the formed connections includes electrical coupling of certain ones of the conductive terminals 112 to a circuit of the semiconductor die 120.

In another implementation, the semiconductor die 120 is attached to the package structure 108 in the cavity 107 using conductive or nonconductive adhesive, with bond pads or other conductive features of the semiconductor die 120 exposed along a top side thereof, and the method 400 includes optional wire bonding at 434 to form the electrical connections between the circuit of the semiconductor die 120 and the conductive routing features of the package structure 108, including electrical connection of certain ones of the conductive terminals 112 to the circuit of the semiconductor die 120.

Figure 10:
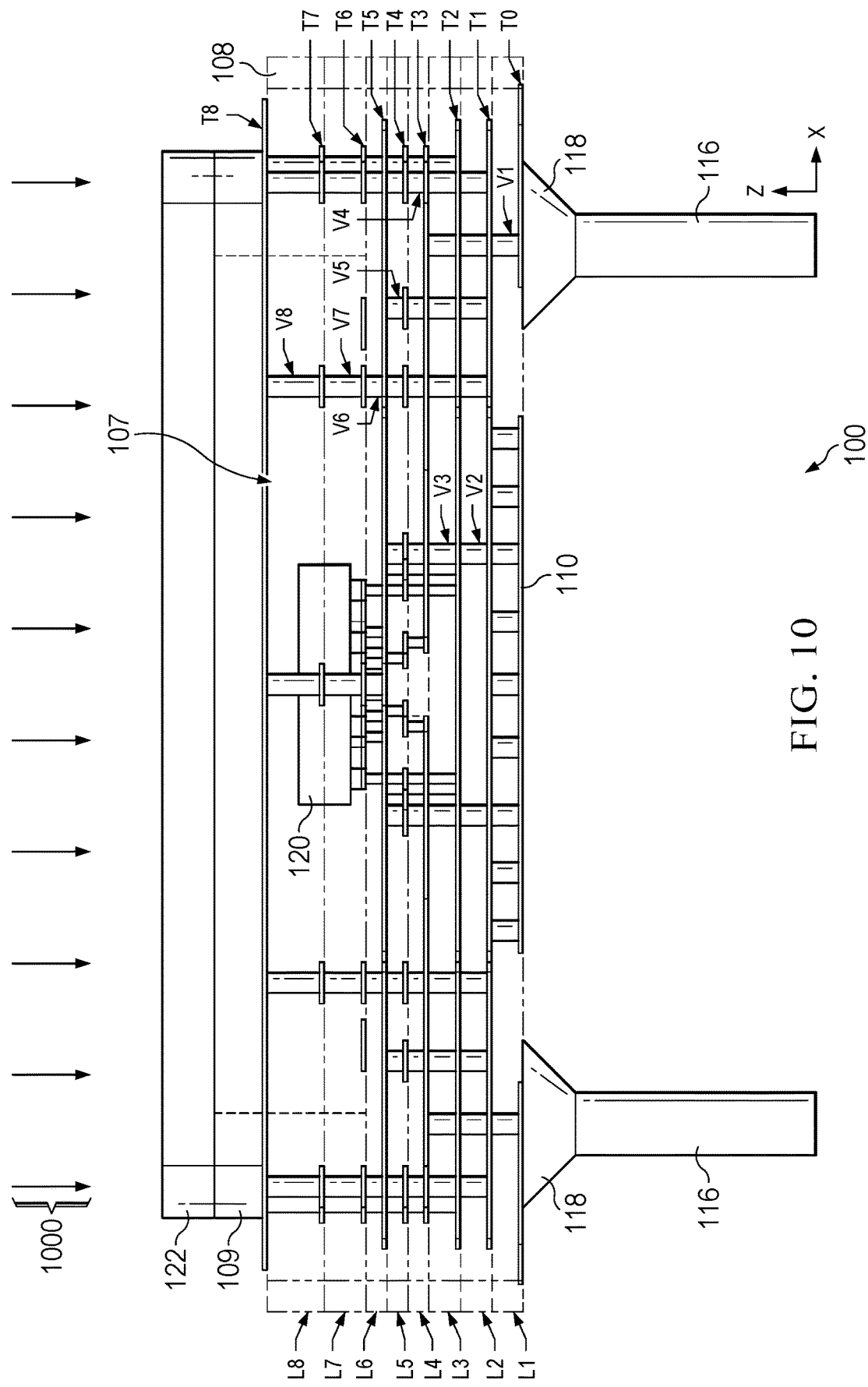

The method 400 continues at 436 in FIG. 4 with lid attachment to cover the opening in the top second side 102 of the package structure 108 and to seal the internal cavity 107. FIG. 10 shows one example, in which a lid attachment and seam molding process 1000 is performed that attaches the lid 122 to the conductive metal rectangular structure 109 and welds the lid 122 to the structure 109, for example, in a controlled (e.g., vacuum) environment. The method 400 in one example also includes a vacuum bake process at 438 in FIG. 4 to complete the packaged electronic device 100 as illustrated and described in connection with FIGS. 1-1E above.

The example electronic devices 100 and 300 provide hybrid leadless ceramic chip carrier device structures that combine the board level reliability benefits of ceramic pin grid array techniques using the pins 116 extending outward from the bottom first side 101 of the package structure 108 with the electrical performance improvements by eliminating adverse antenna effects for the high frequency signal terminals of the devices 100 and 300. The electronic device 300 in FIGS. 3 and 3A can further enhance board level reliability by selective use of conductive (e.g., metal plated) castellations or other conductive indents 334 non-high frequency signals, while advantageously providing non-conductive indents 314 extending to conductive terminals 312 used for high-frequency signals. The above and other benefits can be implemented in many different types and forms of semiconductor circuits, including without limitation high speed amplifiers (e.g., FIG. 1D) and any other circuit, particularly for high-frequency operation and associated signals.

Modifications are possible in the described examples, and other implementations are possible, within the scope of the claims.

What is claimed is:

1. An electronic device, comprising:
   a ceramic package structure having opposite first and second sides, opposite third and fourth sides spaced apart from one another along a first direction, opposite fifth and sixth sides spaced apart from one another along a second direction that is orthogonal to the first direction, and non-conductive indents extending into one of the third and fourth sides;
   a semiconductor die in the package structure;
   a conductive terminal having a planar side exposed along the first side of the ceramic package structure, the conductive terminal electrically coupled to a circuit of the semiconductor die and extending to a first one of the non-conductive indents; and
   conductive pins spaced apart from the conductive terminal and extending outward from the first side of the ceramic package structure along a third direction that is orthogonal to the first and second directions.

2. The electronic device of claim 1, wherein the conductive terminal is electrically coupled to a high frequency signal line of the circuit of the semiconductor die.

3. The electronic device of claim 2, further comprising:
a conductive indent in one of the third, fourth, fifth, and sixth sides of the ceramic package structure; and
a second conductive terminal having a planar side exposed along the first side of the ceramic package structure, the second conductive terminal electrically coupled to a non-high frequency signal line of the circuit of the semiconductor die and extending to the conductive indent.

4. The electronic device of claim 3, wherein:
the first one of the non-conductive indents is an unplated castellation extending into the third side of the ceramic package structure; and
the conductive indent is a plated castellation extending into the one of the third, fourth, fifth, and sixth sides of the ceramic package structure.

5. The electronic device of claim 1, wherein:
the package structure is a multilevel ceramic package structure having an interior cavity that extends to an opening in the second side;
the semiconductor die is in the cavity; and
the electronic device further comprises a lid that covers the opening and seals the cavity.

6. The electronic device of claim 1, wherein the first one of the non-conductive indents is an unplated castellation extending into the third side of the package structure.

7. The electronic device of claim 1, further comprising a thermal pad having a planar side exposed along the first side of the package structure.

8. The electronic device of claim 1, wherein the conductive pins are electrically coupled to a reference node of the circuit of the semiconductor die.

9. A ceramic package structure, comprising:
opposite first and second sides;
an interior cavity that extends to an opening in the second side;
opposite third and fourth sides spaced apart from one another along a first direction;
opposite fifth and sixth sides spaced apart from one another along a second direction that is orthogonal to the first direction;
non-conductive indents extending into one of the third and fourth sides;
a conductive terminal having a planar side exposed along the first side of the ceramic package structure and extending to a first one of the non-conductive indents; and
conductive pins spaced apart from the conductive terminal and extending outward from the first side of the ceramic package structure along a third direction that is orthogonal to the first and second directions.

10. The ceramic package structure of claim 9, further comprising:
a conductive indent in one of the third, fourth, fifth, and sixth sides of the ceramic package structure; and
a second conductive terminal having a planar side exposed along the first side of the ceramic package structure, the second conductive terminal extending to the conductive indent.

11. The ceramic package structure of claim 10, wherein:
the first one of the non-conductive indents is an unplated castellation extending into the third side of the ceramic package structure; and
the conductive indent is a plated castellation extending into the one of the third, fourth, fifth, and sixth sides of the ceramic package structure.

12. The ceramic package structure of claim 11, further comprising a thermal pad having a planar side exposed along the first side of the ceramic package structure.

13. The ceramic package structure of claim 10, further comprising a thermal pad having a planar side exposed along the first side of the ceramic package structure.

14. The ceramic package structure of claim 9, wherein the first one of the non-conductive indents is an unplated castellation extending into the third side of the ceramic package structure.

15. The ceramic package structure of claim 9, further comprising a thermal pad having a planar side exposed along the first side of the ceramic package structure.

16. A method of fabricating an electronic device, the method comprising:
forming a laminated ceramic package structure, comprising: opposite first and second sides; an interior cavity that extends to an opening in the second side; opposite third and fourth sides spaced apart from one another along a first direction; opposite fifth and sixth sides spaced apart from one another along a second direction that is orthogonal to the first direction; non-conductive indents extending into the third and fourth sides; a conductive terminal having a planar side exposed along the first side of the ceramic package structure and extending to a first one of the non-conductive indents;
forming conductive pins spaced apart from the conductive terminal and extending outward from the first side of the ceramic package structure along a third direction that is orthogonal to the first and second directions;
attaching a semiconductor die to the laminated ceramic package structure in the cavity;
electrically coupling the conductive terminal to a circuit of the semiconductor die; and
attaching a lid to cover the opening and seal the cavity.

17. The method of claim 16, further comprising:
electrically coupling the conductive pins to a reference node of the circuit of the semiconductor die.

18. The method of claim 16, further comprising:
forming a conductive indent in one of the third, fourth, fifth, and sixth sides of the ceramic package structure; and
forming a second conductive terminal having a planar side exposed along the first side of the ceramic package structure, the second conductive terminal extending to the conductive indent.

19. The method of claim 18, further comprising:
electrically coupling the conductive terminal to a high frequency signal line of the circuit of the semiconductor die; and
electrically coupling the second conductive terminal to a non-high frequency signal line of the circuit of the semiconductor die.

20. The method of claim 16, further comprising:
electrically coupling the conductive terminal to a high frequency signal line of the circuit of the semiconductor die.

* * * * *